United States Patent
Nandakumar et al.

(10) Patent No.: US 11,011,508 B2
(45) Date of Patent: May 18, 2021

(54) DIELECTRIC SPACED DIODE

(71) Applicant: TEXAS INSTRUMENTS INCORPORATED, Dallas, TX (US)

(72) Inventors: Mahalingam Nandakumar, Richardson, TX (US); Robert Callaghan Taft, Munich (DE); Alan Erik Segervall, Half Moon Bay, CA (US); Muhammad Yusuf Ali, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/220,881

(22) Filed: Dec. 14, 2018

(65) Prior Publication Data

US 2020/0194423 A1 Jun. 18, 2020

(51) Int. Cl.
*H01L 27/02* (2006.01)
*H01L 27/06* (2006.01)
*H01L 29/06* (2006.01)
*H01L 27/08* (2006.01)
*H01L 27/092* (2006.01)
*H01L 29/66* (2006.01)

(52) U.S. Cl.
CPC ...... *H01L 27/0255* (2013.01); *H01L 27/0629* (2013.01); *H01L 27/0814* (2013.01); *H01L 27/0928* (2013.01); *H01L 29/0649* (2013.01); *H01L 29/0688* (2013.01); *H01L 29/66136* (2013.01)

(58) Field of Classification Search
CPC ............ H01L 27/0255; H01L 29/0688; H01L 29/66136; H01L 29/8611–8613
See application file for complete search history.

(56) References Cited

U.S. PATENT DOCUMENTS

| | | | |
|---|---|---|---|
| 6,171,893 B1 * | 1/2001 | Wu | H01L 21/823418 257/E21.619 |
| 7,186,596 B2 * | 3/2007 | Min | H01L 27/0255 257/173 |
| 8,912,576 B2 * | 12/2014 | Chung | H01L 29/66113 257/205 |
| 8,941,181 B2 | 1/2015 | Nandakumar et al. | |
| 9,589,959 B2 | 3/2017 | Nandakumar et al. | |
| 2006/0043489 A1 * | 3/2006 | Chen | H01L 27/0255 257/355 |
| 2008/0023767 A1 | 1/2008 | Voldman | |
| 2009/0185316 A1 * | 7/2009 | Schneider | H01L 27/0255 361/56 |

(Continued)

*Primary Examiner* — Daniel Luke
(74) *Attorney, Agent, or Firm* — Andrew R. Ralston; Charles A. Brill; Frank D. Cimino

(57) ABSTRACT

An electronic device, e.g. an integrated circuit, is formed on a P-type lightly-doped semiconductor substrate having an N-type buried layer. First and second N-wells extend from a surface of the substrate to the buried layer. A first NSD region is located within the first N-well, and a second NSD region is located within the second N-well. A PSD region extends from the substrate surface into the substrate and is located between the first and second NSD regions. A P-type lightly-doped portion of the substrate is located between the N-well and the substrate surface and between the PSD region and the first and second NSD regions.

22 Claims, 18 Drawing Sheets

(56) References Cited

U.S. PATENT DOCUMENTS

2014/0242771 A1* 8/2014 Sharma ............... H01L 27/0255
438/380
2017/0133361 A1 5/2017 Nandakumar et al.

* cited by examiner

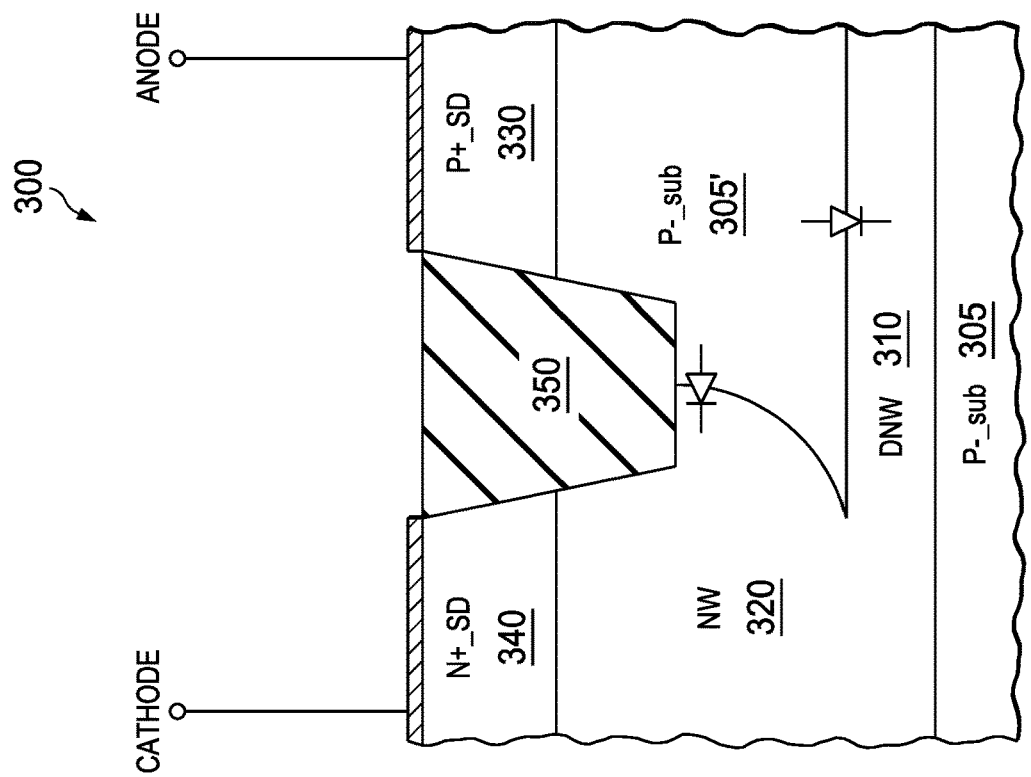
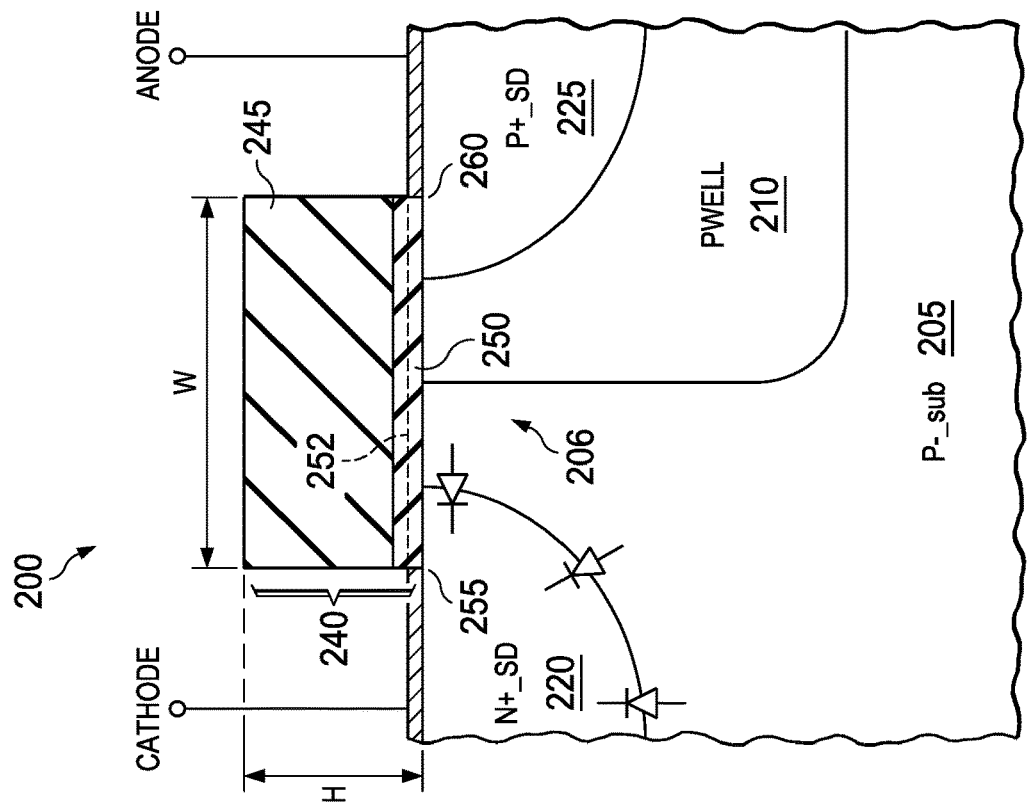
FIG. 3
FIG. 2

DIELECTRIC SPACED DIODE

CROSS REFERENCE TO RELATED APPLICATIONS

This application is related to U. S. patent application Ser. No. 16/220,793, filed on even date herewith (hereinafter the '793 application, the entirety of which is hereby incorporated herein by reference. This application is further related to U.S. Pat. No. 8,941,181, the entirety of which is hereby incorporated herein by reference.

FIELD

This disclosure relates to the field of semiconductor devices, and more particularly, but not exclusively, to diodes with reduced junction capacitance that may be used in an integrated circuit (IC), and in some applications for electrostatic discharge protection of the IC.

BACKGROUND

Integrated circuits often include electrostatic discharge (ESD) protection circuitry designed to dissipate charge from an ESD strike at an input/output (I/O) node. Such circuits may include one or more diodes configured to shunt ESD current from the I/O node to rails of a power supply to dissipate the current. In such applications, it is desirable that the diode responds rapidly to the ESD strike to limit the magnitude and duration of voltage stress on sensitive device elements, such as gate dielectric layers. However, capacitance associated with the P-N junction of the diode may be relatively large in some integrated circuits due to heavily doped P and or N regions and a large doping gradient. Such diode capacitance is undesirable in ESD applications because it slows down the switching speed of the circuit it is designed to protect.

SUMMARY

The inventors disclose various methods and devices that may be beneficially applied to manufacturing integrated circuits (ICs) including diodes with improved operating parameters, e.g. lower junction capacitance and/or higher current capacity. While such embodiments may be expected to provide improvements in reliability of such ICs, no particular result is a requirement of the described invention(s) unless explicitly recited in a particular claim.

In one example the disclosure provides an electronic device, e.g. an integrated circuit, formed on a semiconductor substrate having a first conductivity type. A buried layer that has a second conductivity type is located within the substrate below the substrate surface. A first doped region of the first conductivity type extends from the surface of the substrate into the substrate. A second doped region of the second conductivity type is spaced apart from the first doped region, and extends from the surface of the substrate to the buried layer. A noncontiguous substrate region having a dopant concentration less than the first doped region is located between the first doped region and the buried layer.

Another example provides an electronic device, e.g. an integrated circuit, formed on a P-type lightly-doped semiconductor substrate having an N-type buried layer. First and second N-wells extend from a surface of the substrate to the buried layer. A first NSD region is located within the first N-well, and a second NSD region is located within the second N-well. A PSD region extends from the substrate surface into the substrate and is located between the first and second NSD regions. A P-type lightly-doped portion of the substrate is located between the N-well and the substrate surface and between the PSD region and the first and second NSD regions.

Another example provides a method, e.g. of forming an electronic device, e.g. an integrated circuit, as described above.

BRIEF DESCRIPTION OF THE VIEWS OF THE DRAWINGS

FIG. 2 illustrates a first example diode element in which a dielectric structure, e.g. an SiBLK structure, spaces apart N-type and P-type regions of the diode element, the N-type region being located in a P⁻ region of a substrate region;

FIG. 3 illustrates a second example diode element in which a dielectric structure, e.g. an STI structure, spaces apart N-type and P-type regions of the diode, the N-type region being located in an N-well connected to a deep N-well;

DETAILED DESCRIPTION

The present disclosure is described with reference to the attached figures. The figures may not be drawn to scale and they are provided merely to illustrate the disclosure. Several aspects of the disclosure are described below with reference to example applications for illustration, in which like features correspond to like reference numbers. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events may be required to implement a methodology in accordance with the present disclosure.

This disclosure benefits from recognition by the inventors that diode performance in the context of ESD protection may be improved in some implementations by reducing junction capacitance of the diode and reducing the resistance associated with the diode junction. Such improvement may employ a novel dielectric spacing structure between the diode anode and cathode regions that aligns the anode-cathode space at a substrate surface, and blocks dopant implant into the space, while minimizing contribution by the spacer to the junction capacitance. Improved implementations may also employ a buried layer that provides a distributed parallel current path between the anode and the cathode, effectively reducing the resistance to current during an ESD event.

Additional details of some previously described ESD diodes may be found in U.S. Pat. No. 8,941,181.

Figure 1:
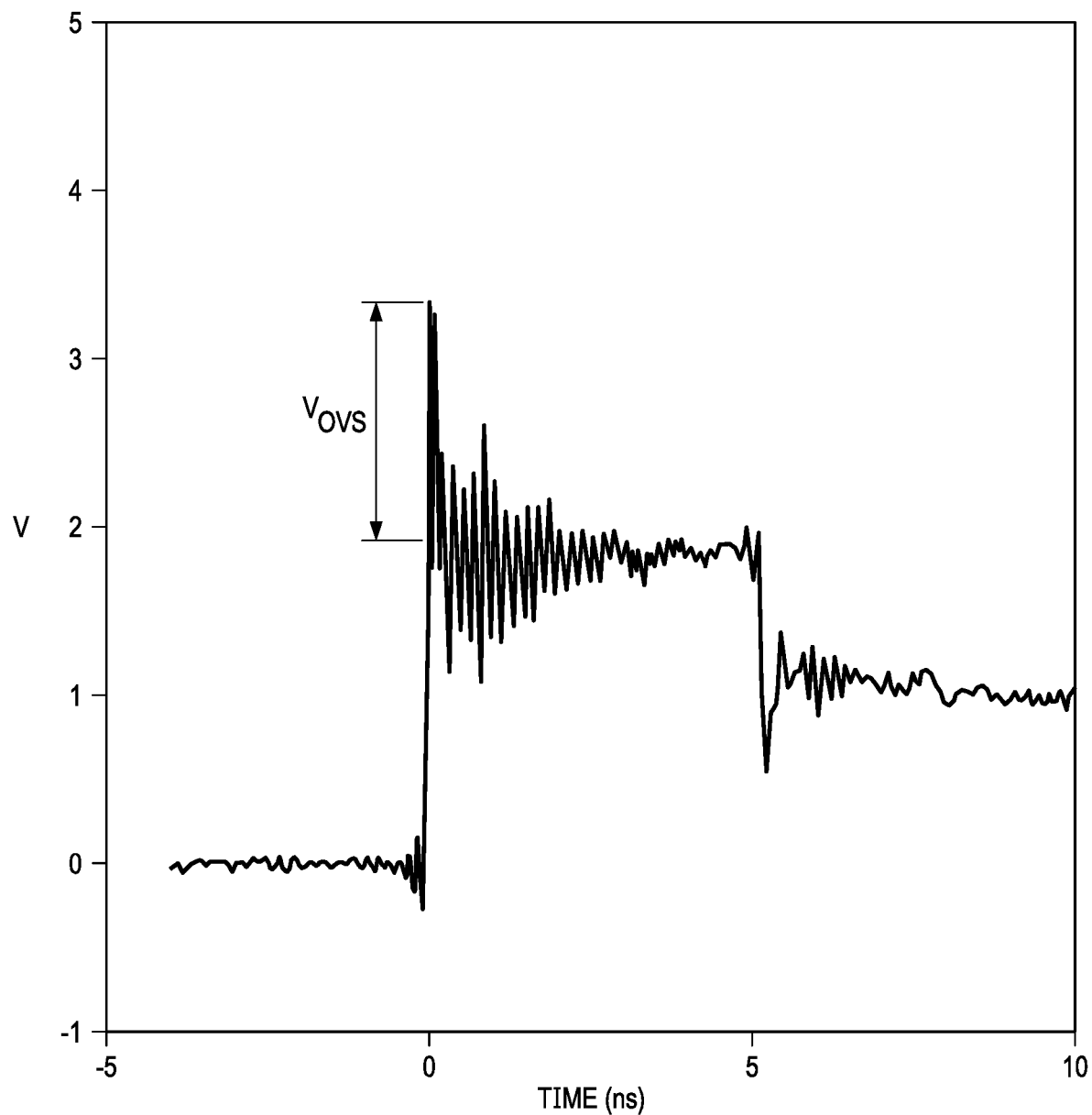
FIG. 1 illustrates a representative time-domain response of an electrostatic discharge (ESD) protection diode to a test pulse input.

Those skilled in the pertinent art are familiar with relevant operating characteristics of ESD protection diodes, and the following serves as a brief overview. When a diode terminal experiences a voltage related to an ESD event, the response of the diode to the voltage is not instantaneous. Full current flow through the diode is delayed by a period related to the junction capacitance ($C_j$) and resistance ($R_{ON}$). Before the diode reaches a stable conductive state, the voltage may overshoot a target value for the protected node. This principle is illustrated in FIG. 1, in which a 5 ns transmission line pulse (TLP) applied to an ESD diode results in a voltage overshoot ($V_{OVS}$) to about 3.5 V before the terminal voltage reaches a steady state at about 2 V. This overshoot is generally undesirable, as sensitive structures connected to the protected node, e.g. gate dielectrics, may be overstressed by even a brief excursion above the target voltage.

An ESD diode may be characterized by several electrical parameters via TLP testing, including turn-on voltage ($V_{t1}$), holding voltage ($V_H$), $R_{ON}$, and current at failure ($I_{t2}$). Generally, it is desirable for the ESD capacitor to have low $C_j$, $R_{ON}$, and $V_{OVS}$. One performance metric that may be used to compare performance among different diode designs is the ratio of $I_{t2}$ to $C_j$, abbreviated $I_{t2}/C_j$. A larger value of $I_{t2}/C_j$ implies a larger $I_{t2}$, a smaller $C_j$, or both. This metric is used in this description to distinguish relative performance of various ESD diodes.

FIG. 2 illustrates an ESD diode element 200 according to one example. The diode element 200 may be suitable for use as an ESD protection diode in an IC, but embodiments are not limited to any particular use. The diode element 200 includes a substrate 205, e.g. a lightly-doped P-type silicon wafer, in which a P-type region 210 (sometimes referred to as a P-type well 210 or P-well 210), an N-type region 220 and a P-type region 225 have been formed. In various embodiments the P-type region 210 has a lower concentration of majority carriers, e.g. mobile holes, than does the P-type region 225. The N-type region 220 is connected to a cathode terminal, and the P-type region 225 is connected to an anode terminal. Depending on whether the diode element 200 is used in a high-side diode or a low-side diode, the anode or the cathode may be connected to a protected node, e.g. an input/output (I/O) terminal of an IC. The regions 220, 225 may optionally be formed during source and drain implants that form MOS transistors elsewhere on the substrate 205. Thus, the N-type region 220 may be referred to as an NSD region 220, and the P-type region 225 may be referred to as a PSD region 225. The substrate 205 may be a lightly doped substrate, e.g. a silicon wafer. Optionally the P-type region 210 may be omitted, which may reduce $V_{OVS}$ in some cases. Because the NSD region 220, and the PSD region 225 if present, is formed in the underlying lightly doped P material (P-type substrate 205) the diode element 200 may be referred to as a PSUB-ESD diode. In this example embodiment the P-type region 210 is implemented as a compensated well, e.g. the NSD region 220 is formed in the lightly-doped substrate 205, leaving an unmodified portion 206 of the substrate 205 located between the P-type region 210 and the NSD region 220 that has a lower dopant concentration than the PSD region 225 and the P-type region 210. In a nonlimiting example, the substrate 205 may be doped with $1E13$-$1E16$ cm$^{-3}$ boron atoms, the P-type region 210 may be doped with about $1E17$ cm$^{-3}$ boron atoms, the NSD region 220 may be doped with $1E20$-$5E21$ cm$^{-3}$ phosphorous atoms, and the PSD region 225 may be doped with $1E20$-$5E21$ cm$^{-3}$ boron atoms.

The diode element 200 includes a dielectric layer 240, more generally referred to as a dielectric structure 240, located over the substrate 205 and the substrate portion 206 at the surface of the substrate 205, the P-type region 210, the NSD region 220 and the PSD 225. (For brevity hereafter, these surfaces may be referred to collectively as the "substrate surface".) The dielectric structure 240 includes a first dielectric layer 245 located over an optional second dielectric layer 250. Without implied limitation the first dielectric layer 245 may be referred to as the upper dielectric layer 245 and the second dielectric layer 250 may be referred to as the lower dielectric layer 250. The lower dielectric layer 250 is located directly on the substrate surface. The lower dielectric layer 250 may include a noncontiguous portion of a thermally grown gate dielectric layer, e.g. silicon dioxide. Herein, a "gate dielectric layer" is defined as a thermally grown dielectric layer that includes the underlying substrate material that is used as a gate dielectric of a MOS transistor in some locations of the IC of which the diode element is a part. The thermally grown dielectric layer may be an oxide of the substrate material, e.g. silicon dioxide, and may optionally include a nitride of the substrate material, e.g. silicon nitride, which may be formed by thermal nitridation during layer growth and/or subsequent direct or remote plasma nitridation. The lower dielectric layer 250 may also optionally include a noncontiguous portion of a subsequently formed dielectric layer, e.g. a plasma-deposited oxide layer. A dashed interface 252 represents the delineation of these two layers within the dielectric structure 240 according to such embodiments.

The upper dielectric layer 245 may be another dielectric layer used in forming MOS transistors elsewhere on the substrate 205. As described further below, the upper dielectric layer 245 may be a nitrogen-containing dielectric layer, such as silicon nitride (SiN) or silicon oxynitride (SiON). For example, the upper dielectric layer 245 may be a noncontiguous portion of a dielectric layer used to form gate sidewalls, or to block silicide formation on portions of the substrate. Without limitation, this layer may be referred to as a silicide block layer, or SiBLK. The dielectric structure 240 may be referred to without implied limitation as a "SiBLK spacer", and a diode formed consistent with the diode element 200 may then be referred to as a "SiBLK-spaced diode".

The SiBLK spacer 240 has a height H and a width W. The height is the sum of the upper dielectric layer 245 thickness and the lower dielectric layer 250 thickness. These layer thicknesses are not limited to any particular value, but may be determined by the process flow used to produce the IC of which the diode element 200 is a part. For example, the lower dielectric layer 250 may include a portion of a dielectric layer used form a MOS gate oxide, and may also include a thin oxide layer optionally deposited over a gate oxide layer after a polysilicon gate etch process. In some embodiments the total thickness of the lower dielectric layer 250 may be within a range from about 5 nm to about 30 nm. As mentioned, the upper dielectric layer 245 may be a SiBLK layer comprising, e.g. SiN or SiON. In some embodiments the SiBLK layer may have a thickness within a range from about 10 nm to about 100 nm. Thus in various embodiments the thickness H may be within a range from about 15 nm to about 130 nm. This range may be expected to vary depending on device scaling.

The width W may be selected to result in a desired spacing between the NSD region 220 and the PSD region 225, and is thus design-dependent in general. In some embodiments a width of about 250 nm to about 350 nm may provide acceptable device performance. This value also is expected to scale with overall device scaling. Due to physical and current technical limitations it is expected that a manufacturable lower limit of the width is about 100 nm, though this limit may decrease with improvements in process technology.

Additional details regarding the SiBLK spacer 240 may be found in the '793 application.

As described further below, the SiBLK spacer 240 may help define the space between the NSD region 220 and the PSD region 225. In combination with an NSD photoresist implant mask and a P+ SD photoresist implant mask, N-type dopants may be selectively implanted in the NSD region 220 and P-type dopants may be selectively implanted into the PSD region 225. Thus the dielectric structure may act as a spacer by limiting the lateral extent of the NSD region 220 and PSD region 225 to preserve the space between these regions underneath the SiBLK spacer 240.

A first side 255 of the SiBLK spacer 240 is located over the NSD region 220, and a laterally opposing second side 260 of the SiBLK spacer 240 is located over the PSD region 225. Thus the SiBLK spacer 240 partially overlaps each of the NSD region 220 and the PSD region 225. While not electrically active, the SiBLK spacer 240 acts similarly to a gate structure in a MOS transistor in the sense that the SiBLK spacer 240 blocks dopants from the implants that form the NSD region 220 and the PSD region 225 from the substrate under the SiBLK spacer 240, thus providing lateral separation of the PN junction of the diode element 200. As described further below, the SiBLK spacer 240 in combination with NSD and PSD resist masks may also beneficially shield the PN junction from co-implants (e.g. carbon, nitrogen) used to control the diffusion of N-type and P-type dopants in the NSD and P+ SD regions (wherever they are used in the IC). Such dopants may increase the capacitance of the PN junction, undesirably increasing the capacitive load of the diode element 200.

Because the SiBLK spacer 240 is nonconductive, there is no connection between the SiBLK spacer 240 and the anode terminal or cathode terminal, and negligible parasitic capacitance associated with the overlap of the SiBLK spacer 240 and the NSD region 220 or PSD region 225. Furthermore the compensated well of the diode element 200 imparts a relatively low $C_j$ associated with the PN junction due to, e.g. the spatial distribution of the charge depletion region associated with the junction. In view of these features, the PSUB-ESD diode 200 with the SiBLK spacer 240 is expected to provide a relatively rapid response and a relatively low voltage overshoot in the event of an ESD event.

FIG. 3 illustrates a diode element 300 according to another example. The diode element 300 is formed in a lightly diode substrate 305, illustrated as a P⁻ substrate in the present example. A deep N-well (DNW) 310 is located within the substrate 305, such that a lightly doped noncontiguous portion 305' of the substrate 305 is located between the DNW 310 and the surface of the substrate 305. Hence the diode element 300 and similar diodes consistent with the disclosure may be referred to generally as a deep N-well ESD, or DNW-ESD diode. Adjacent the substrate portion 305', an N-well 320 is located between the DNW 310 and the substrate surface. A heavily doped PSD region 330 is located between the substrate portion 305', and a heavily doped NSD region 340 is located between the N-well 320 and the surface. In a nonlimiting embodiment the DNW 310 and the N-well 320 may be doped with 1E18-2E18 cm⁻³ phosphorous atoms. A dielectric isolation structure 350, e.g. an STI structure, is located between the PSD region 330 and the NSD region 340.

The P⁻ substrate portion 305' and the N-well 320 form a first junction that intersects the isolation structure 350 at a bottom surface of the isolation structure 350. A second junction is located between the substrate portion 305' and the DNW 310. Because the substrate portion 305' has a relatively low dopant concentration, the depletion region between the substrate portion 305' and the DNW 310 and N-well 320 is wider than would be the case if the substrate portion 305' had a dopant concentration typical of a P-well. In some examples the substrate portion 305' may be entirely or mostly depleted of majority carriers (holes). Hence the junction capacitance $c_j$ seen at the anode is relatively low, e.g. lower than would be the case if the substrate portion 305' had a dopant concentration typical of a P-well. Furthermore, the isolation structure 350 may block source/drain dopants from the junction at the bottom of the isolation structure, which dopants could otherwise increase the junction capacitance. The $C_j$ may come at the expense of higher resistivity of the substrate portion 305', which could adversely affect $R_{ON}$. However, the relatively long junction, e.g. the combination of the first and second junctions, provides a wide current path between the anode and the cathode, compensating for the higher resistivity and resulting in a relatively low overall resistance during an ESD event and a relatively high $I_{t2}$.

Figure 4B:
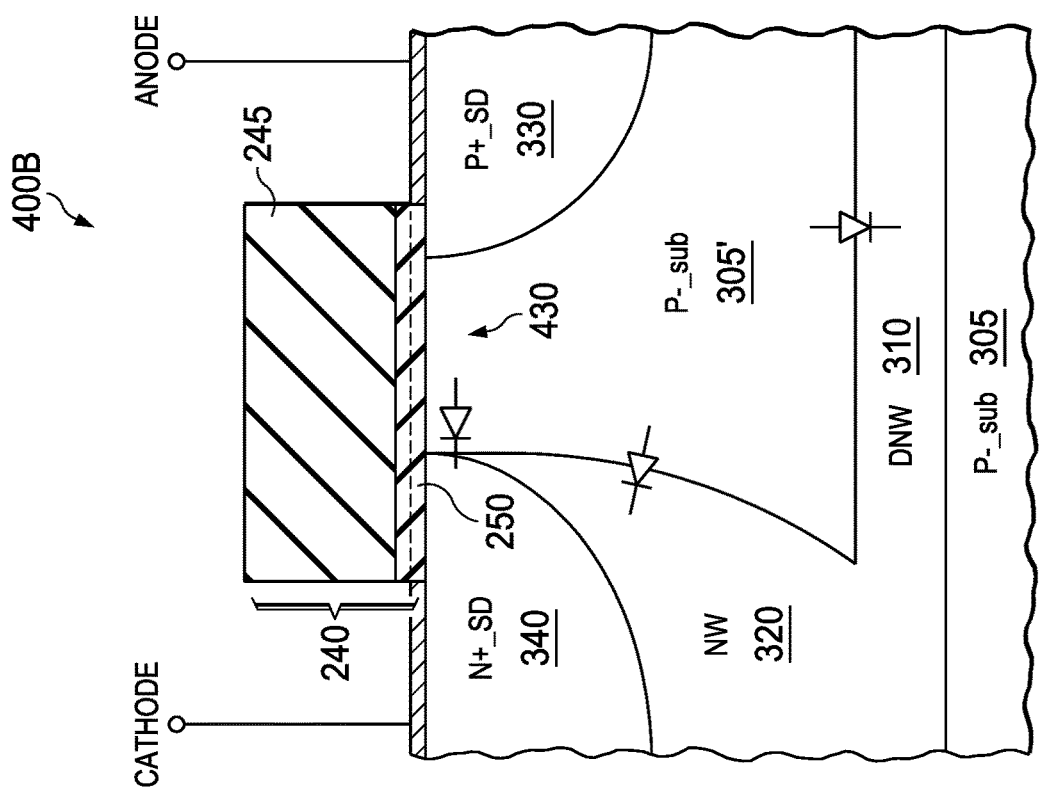
FIGS. 4A and 4B illustrate variations of a third example diode element in which a dielectric structure, e.g. an SiBLK structure, spaces apart N-type and P-type regions of the diode, the N-type region being located in an N-well connected to a deep N-well.
Figure 4A:
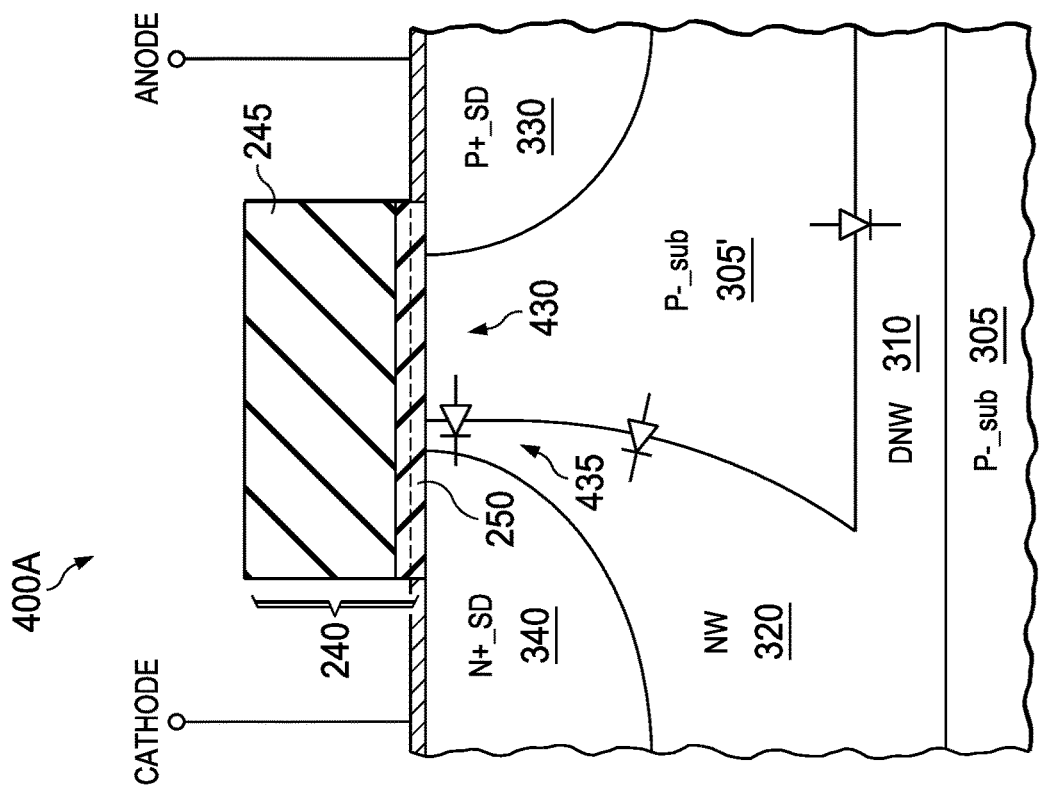

FIG. 4A illustrates another example, a diode element 400, in which like features of the diode element 300 retain their designation in FIG. 4. As was the case for the diode element 300, the N-well 320 extends down to the DNW 310, and the noncontiguous substrate portion 305' is located between the DNW 310 and the PSD region 330. Unlike the diode element 300, the noncontiguous substrate portion 305' extends to the surface, with a portion 430 located between the NSD region 340 and the PSD region 330. The N-well 320 also extends to the surface, and in the illustrated example a portion 435 is of the N-well 320 is located between the noncontiguous substrate portion 430 and the NSD region 340. The dielectric structure 240 is located between and over the NSD region 340 and the PSD region 330, and over the portions 430, 435. The diode element 400 includes first and second junctions similar to the first and second junctions of the diode element 300, with the first junction extending to the substrate surface under the dielectric structure 240.

In some other implementations, the N-well region 320 boundary may intersect the NSD region 340 boundary at or below the surface of the substrate 305, as exemplified in FIG. 4B. In such cases the N-well 320 does not intersect the substrate 305 surface. Such a configuration may advantageous in some circumstances, e.g. to establish a desired diode capacitance and/or overshoot.

In some examples, a polysilicon spacer may be used in lieu of the SiBLK spacer 240. In such cases a gate electrode structure may be formed over the substrate 305 surface between the NSD region 340 and the PSD region 330 using a same photo mask and process sequence as used to form MOS transistor gates elsewhere on the substrate 305. The gate electrode structure may be essentially indistinguishable from a transistor gate structure, including polysilicon gate electrode, gate dielectric and sidewall spacers, but there is no requirement that the spacer gate electrode structures be identical to gate structures used in MOS transistors. While the polysilicon spacer may act similarly to the SiBLK spacer 240 in blocking implanted dopants from the substrate between the PSD 330 region and the NSD region 340, the polysilicon spacer would be expected to add significant capacitance to the diode element 400, and therefore may not be suitable in as many applications as the SiBLK spacer 240. In particular, it is expected that a diode using a polysilicon spacer but otherwise identical to the diode element 400 would have a lower $I_{t2}/C_j$ metric.

In various examples, the diode elements 300 and 400 are formed with a corresponding mirror image diode element. For example, the diode element 400 may be paired with a mirror-image instance of the diode element 400 such that the substrate portion 305' is completely isolated from the substrate 305 by the DNW 310 and an N-well 320 on each side of the substrate portion 305'. This configuration is exemplified in FIG. 5A and FIG. 10L. In another example, in a physical implementation the substrate portion 305' may be surrounded by an N-well 320 ring, e.g. as exemplified in FIG. 7A.

Figure 5A:
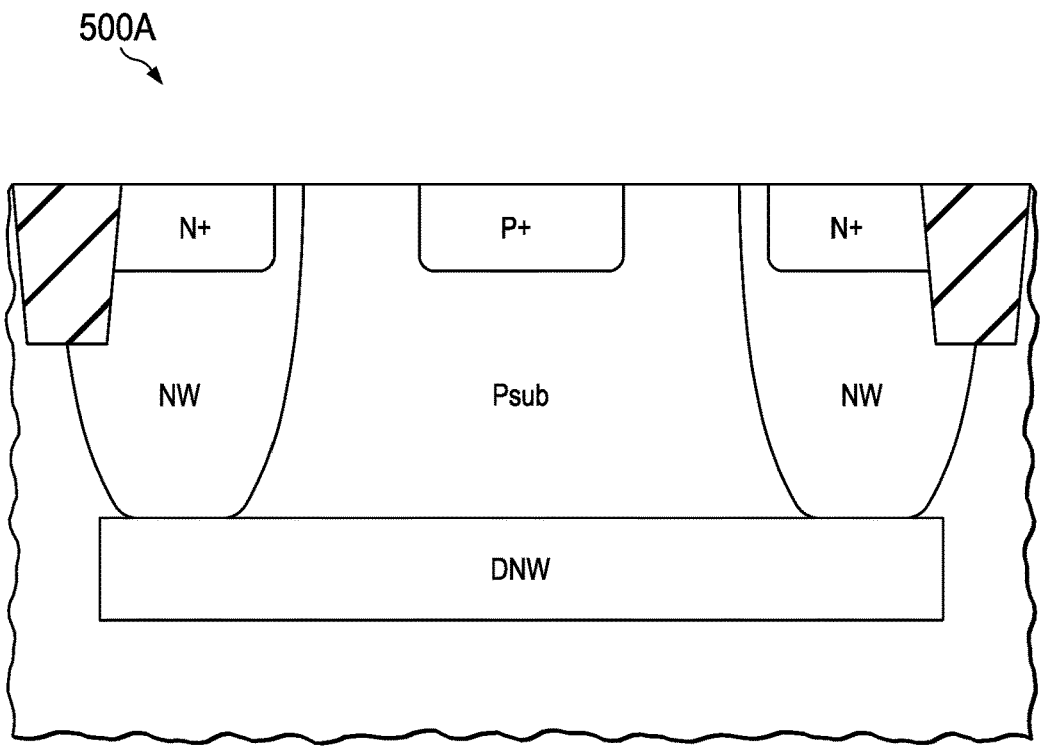
FIGS. 5A-5D shows four variants of a deep N-well (DNW) diode, including no dielectric spacer (5A), an STI spacer (5B), an SiBLK spacer (5C), and a gate spacer (5D)
Figure 5B:
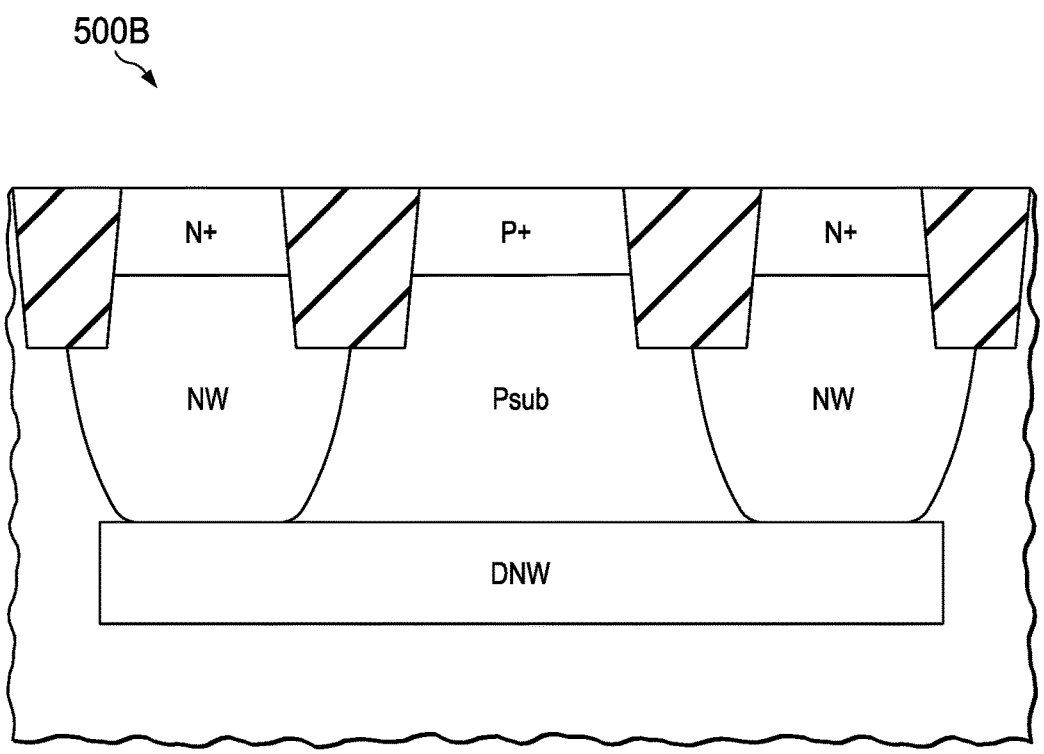
Figure 5C:
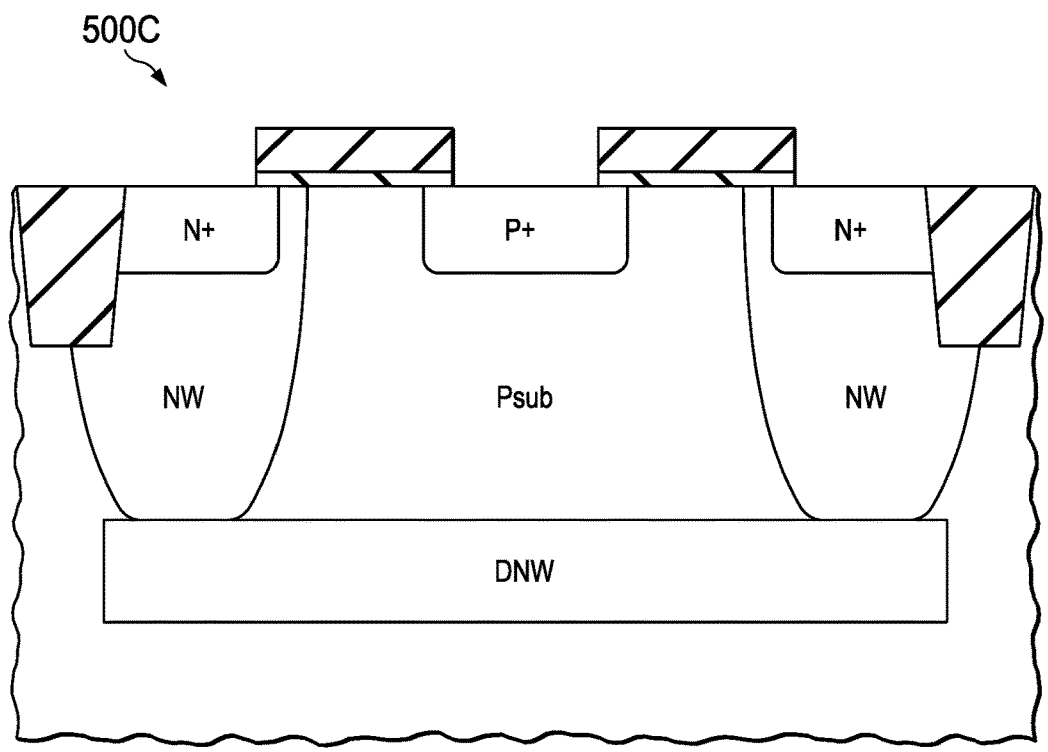
Figure 5D:
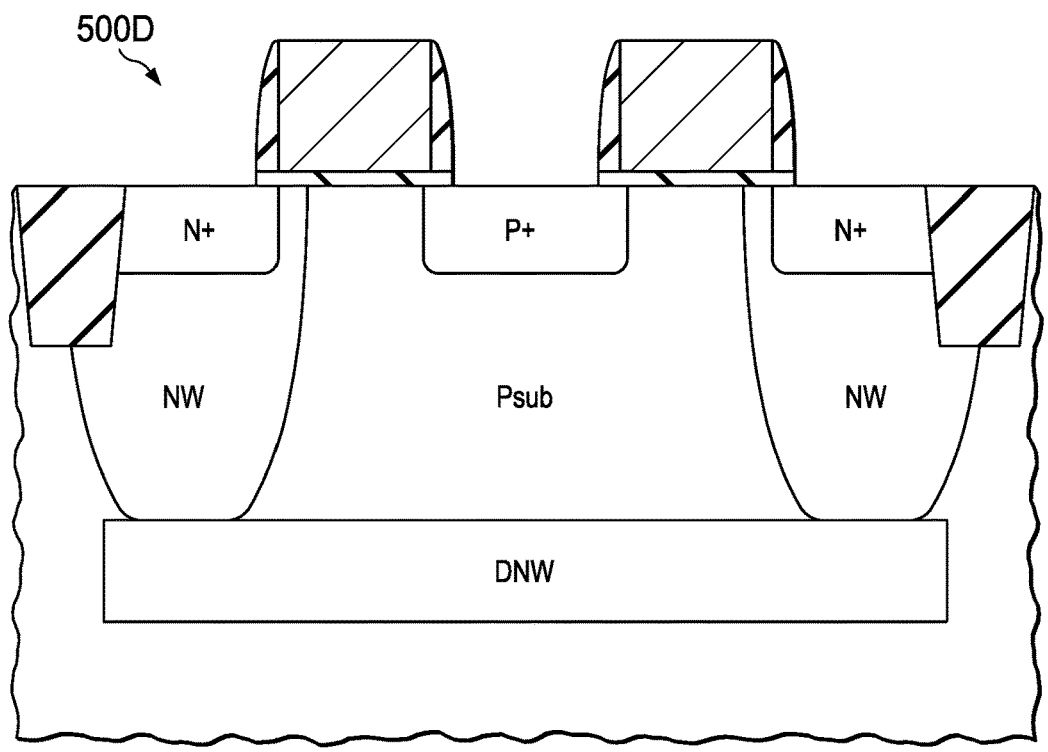

FIGS. 5A-5D illustrate examples of DNW-ESD diodes as may be implemented consistent with FIGS. 3 and 4. FIG. 5A shows a DNW diode cell 500A that is representative of the general structure of doped regions consistent with the deep N-well architecture described above. Note that the diode cell 500A includes a central PSD region between two NSD regions, and the NSD regions are located in N-wells that extend into the substrate to a deep-n layer. Thus the non-contiguous portion of the P⁻ substrate located between the DNW and the surface is isolated from the substrate outside the N-wells and the DNW. Further, the P⁺ SD region may operate as an anode to both the NSD regions. Thus the diode cell 500A is functionally similar to two parallel diodes. Multiple instances of the diode cell 500A may be laterally repeated to form an ESD protection diode of a desired current capacity. FIG. 5B shows a diode cell 500B that is similar to the diode element 300 and includes STI structures that isolate the PSD region from the two NSD regions. FIG. 5C shows a diode 500C similar to the diode element 400, including a SiBLK spacers, and FIG. 5D shows a diode cells 500D that includes a polysilicon structure spacer, e.g. a gate structure.

Figure 6:
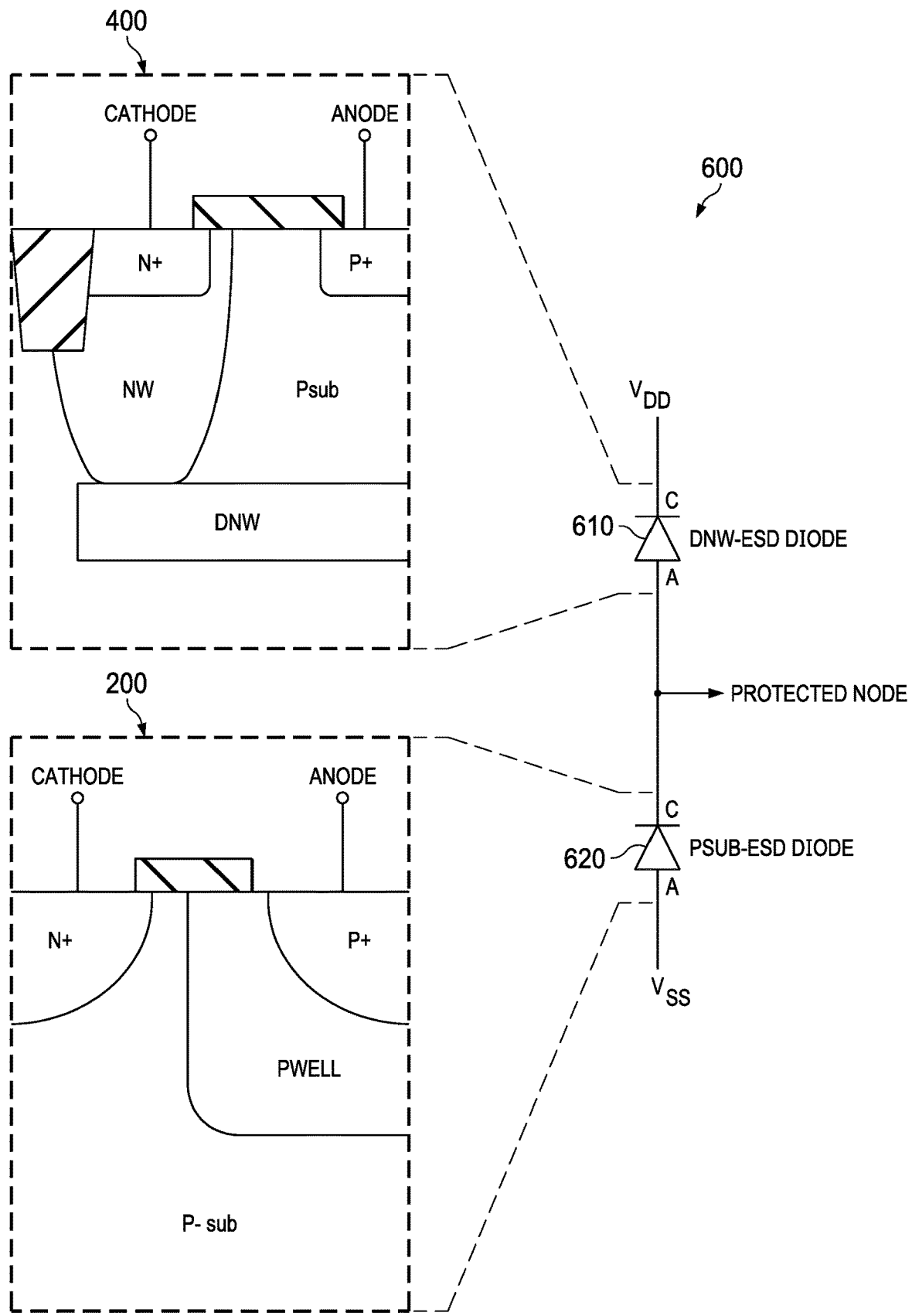
FIG. 6 provides an example ESD protection circuit.

FIG. 6 illustrates an example ESD protection circuit 600 that may be formed using a DNW diode cell consistent with the disclosure. The circuit 600 includes a high-side diode 610 in series connection with a low-side diode 620. The cathode of the diode 610 is connected to a positive voltage rail $V_{DD}$, and the anode of the diode 620 is connected to a low-side, e.g., negative voltage, rail $V_{SS}$. The anode of the high-side diode 610 is connected to the cathode of the low-side diode 620, which connection provides a protected node that may be connected to, e.g. a terminal of a transistor to be protected. As shown, the high-side diode 610 is a DNW-ESD diode, e.g. as exemplified by the diode element 400, and the low-side diode 620 is a PSUB-ESD diode, e.g. as exemplified by the diode element 200. While the diode element 400 may have a greater $I_{t2}/C_j$ metric than the diode element 200, it may not be desirable to use the diode element 400 in the low-side position, as the N-well 320 and DNW 310 would not be reverse-biased with respect to the substrate 305. Furthermore when the diode element 400 is used in the high-side diode 610 the DNW 310 is positively biased with respect to the substrate 305, such that the PN junction is depleted and the virtual capacitor associated with the junction is pre-charged. Thus the diode element 400 may respond more quickly to an ESD event when used in the high-side diode 610 rather than the low-side diode 620. These issues do not apply to the diode element 200 used in the low-side diode 620. Accordingly, the illustrated configuration with diode 610 configured as a DNW-ESD diode and the diode 620 configured as a PSUB-ESD diode provides effective ESD protection at the protected node.

Figure 7A:
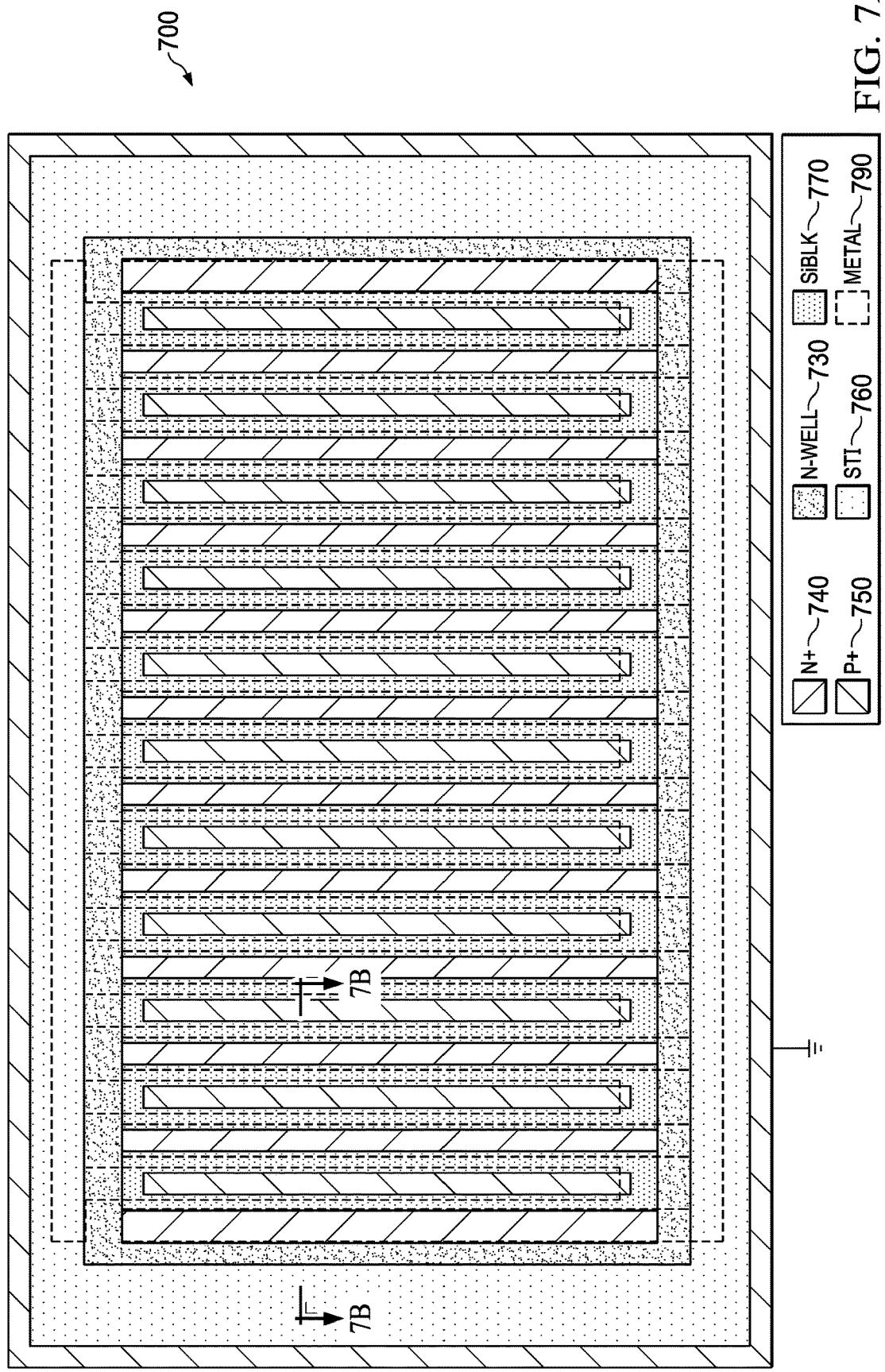
FIGS. 7A and 7B illustrate an implementation of a DNW-ESD diode with a SIBLK spacer; an FIGS. 8A and 8B illustrate an implementation of a P-substrate (PSUB)-ESD diode with a SIBLK spacer.
Figure 7B:
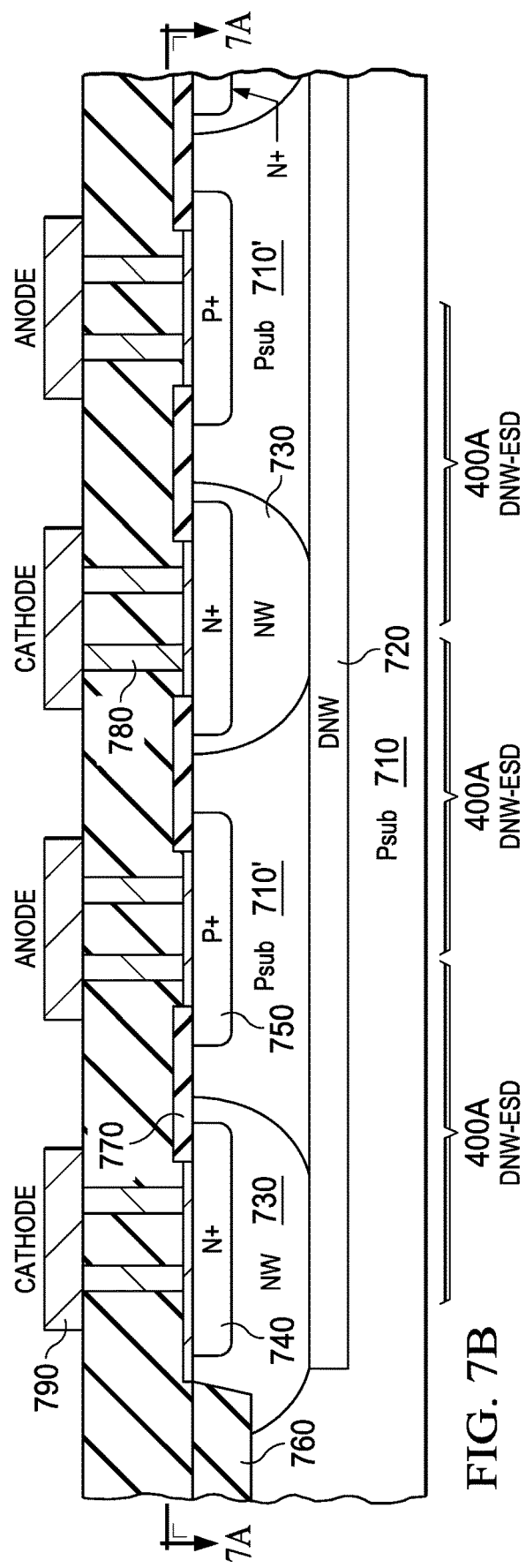

FIGS. 7A and 7B respectively illustrate side and plan views of an example DNW-ESD diode 700 that may implement the diode 610 in a semiconductor substrate. The diode 700 is implemented as described for FIG. 5C, e.g. using the SiBLK configuration and parallel diodes elements in several interdigitated fingers. FIGS. 7A and 7B illustrate various regions and layers of the diode 700, e.g. a lightly doped substrate 710, DNW 720, NW 730, N⁺ contact regions 740, P⁺ contact regions 750, STI structures 760, SiBLK stripes 770, contacts 780 and a metal layer 790. The metal layer 790 is patterned to form a multi-fingered anode interdigitated with a multi-fingered cathode. Each neighboring pair of interdigitated electrode fingers is separated by a strip of SiBLK 770. Each of the SiBLK 770 strips partially overlies an N⁺ contact region strip 740 and P⁺ contact region stripe 750. Each P⁺ contact region 750 is shared with two N⁺ contacts regions 740, forming two parallel diodes, such as the diode element 400. The interdigitated electrodes are surrounded by an unreferenced PSD isolation ring. The isolation ring may be grounded such that the lightly doped substrate 710 is grounded. In this manner, the junction between the DNW 720 and the substrate 710 may be reverse-biased when the cathode is connected to a higher potential, e.g. $V_{DD}$. The illustrated example is representative of various other examples, such as using STI spacers and/or gate spacers are in lieu of the SiBLK 770 strips. Furthermore, while it is contemplated that the diode 700 will only include one type of spacer, there is no such requirement. The illustrated diode 700 may be extended as needed to provide a desired current capacity to protect the protected node.

Figure 8A:
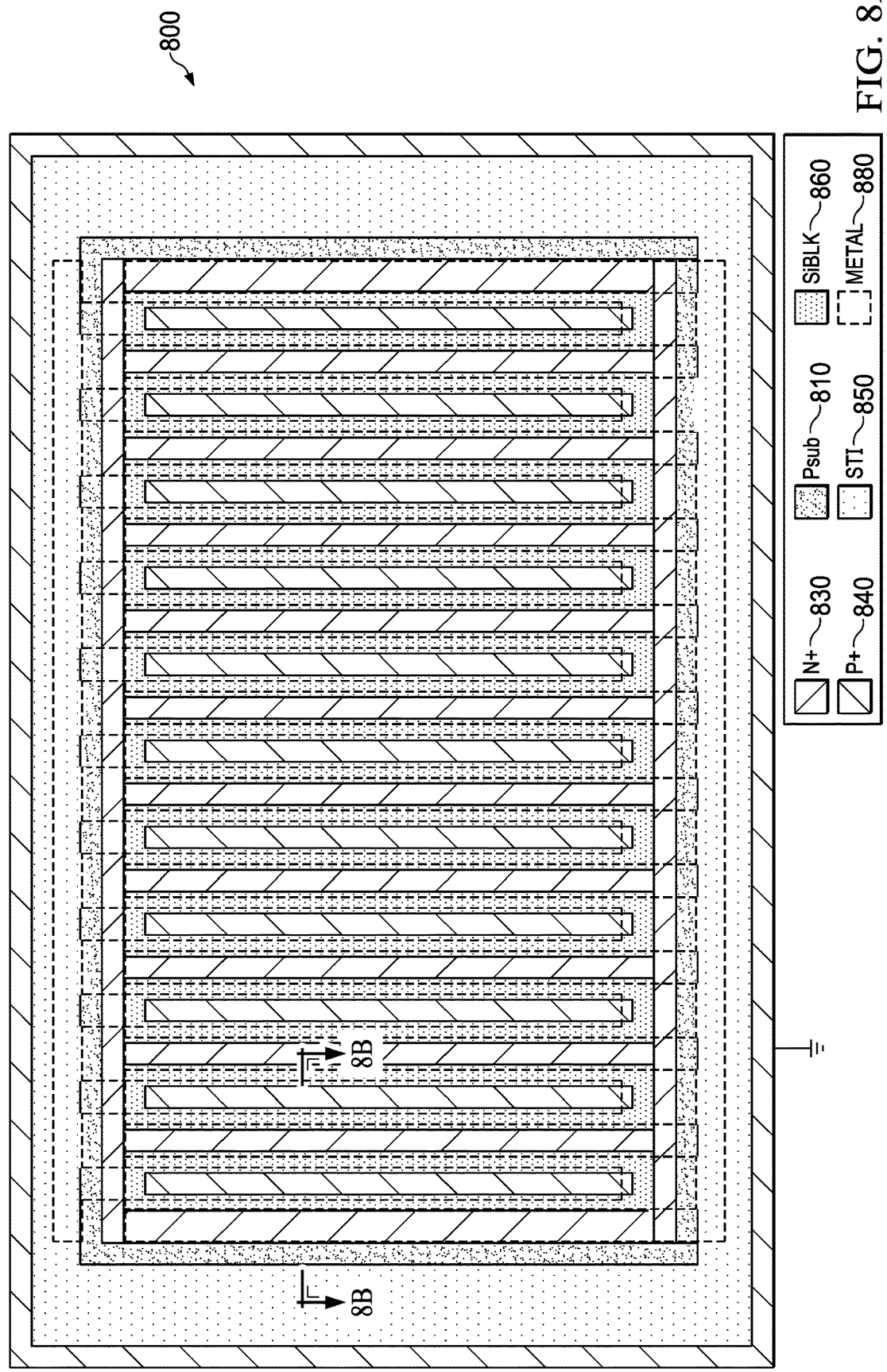
Figure 8B:
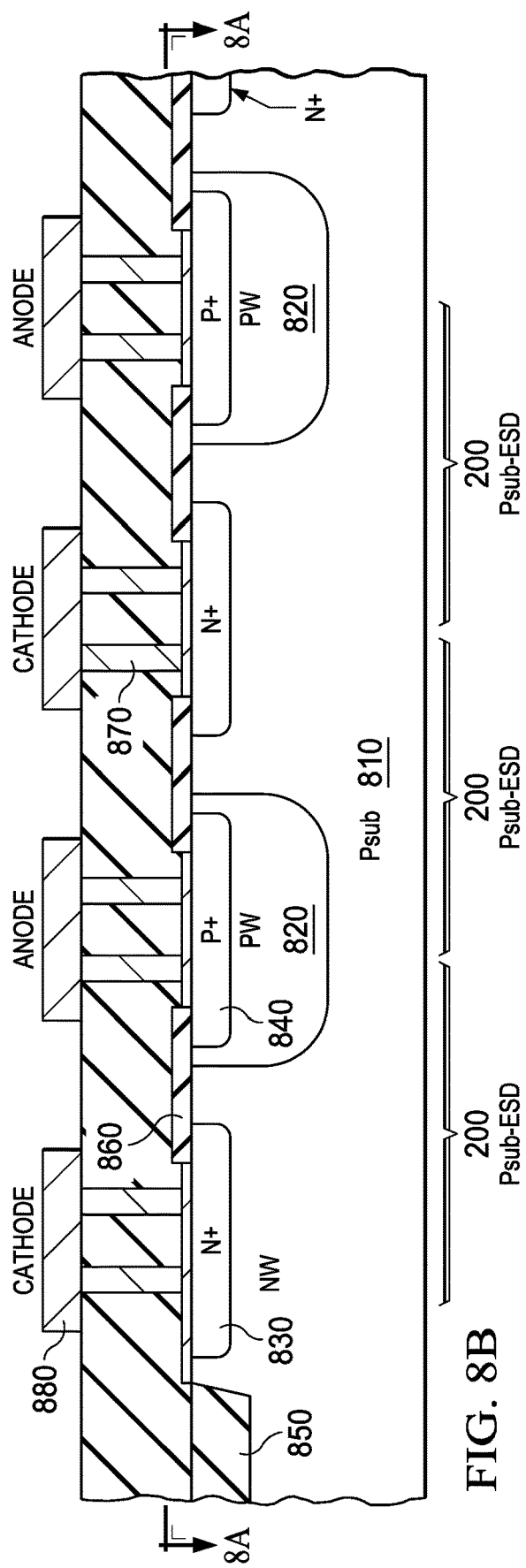

FIGS. 8A and 8B respectively illustrate side and plan views of an example PSUB-ESD protection diode 800 that may implement the diode 620 in a semiconductor substrate. The diode 800 in the illustrated example is implemented using the SiBLK strip configuration as described for the diode 700, and includes a lightly doped substrate 810, PW 820, N⁺ contact regions 830, P⁺ contact regions 840, STI structures 850, SiBLK stripes 860, contacts 870 and a metal layer 880. The metal layer 880 is patterned to form a multi-fingered anode interdigitated with a multi-fingered cathode. Each neighboring pair of interdigitated electrode fingers is separated by a strip of SiBLK 860. Each of the SiBLK 860 strips partially overlies an N⁺ contact region strip 830 and a P⁺ contact region stripe 840. Each P⁺ contact region 840 is shared with two N⁺ contacts regions 830, forming two parallel diodes, such as the PSUB-ESD diode element 200. The interdigitated electrodes are surrounded by an unreferenced NWELL isolation ring. The illustrated cell 800 may be extended as needed to provide a desired current capacity to protect the protected node.

Figure 9:
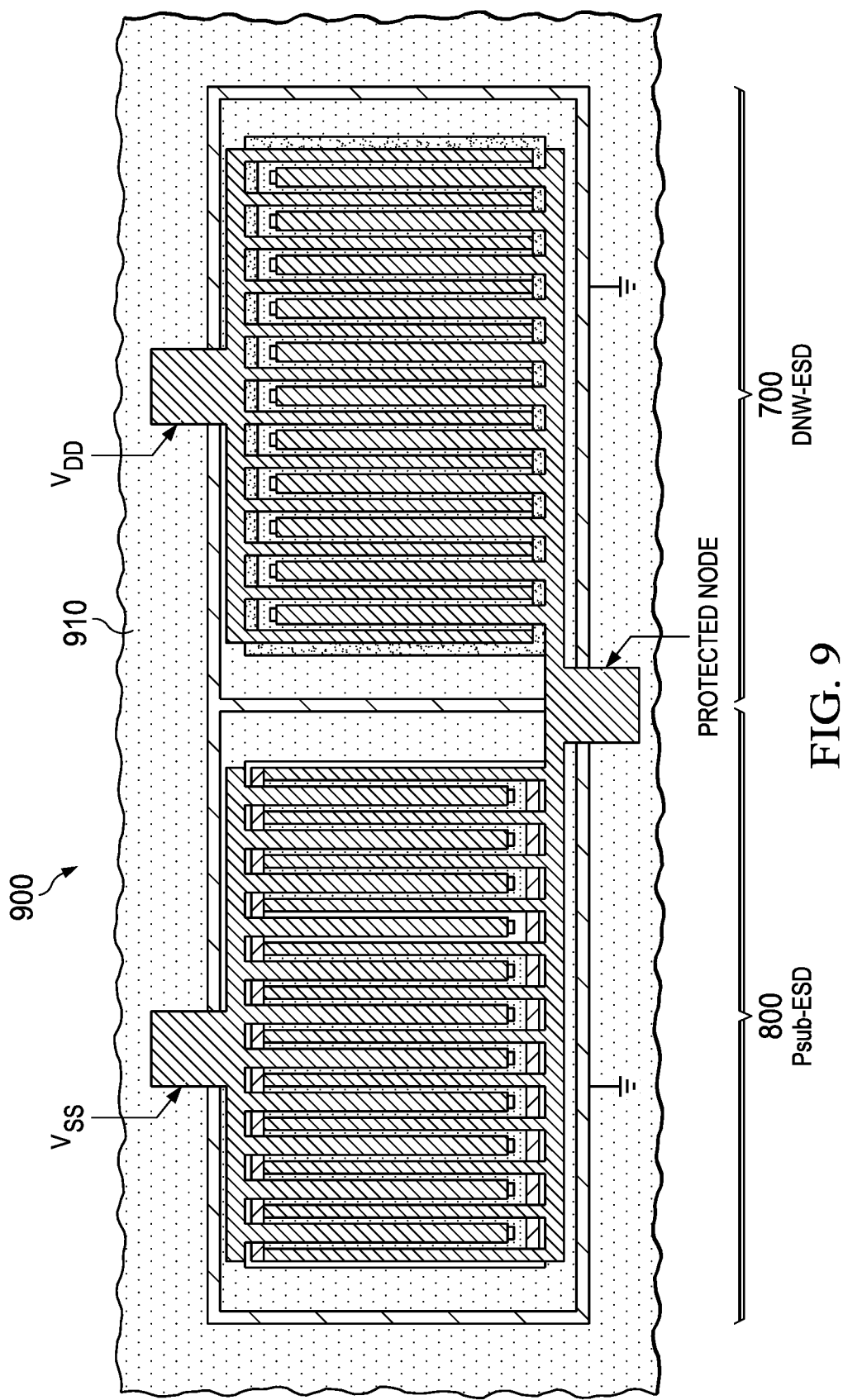
FIG. 9 illustrates a plan view of an example ESD protection circuit, such as that shown in FIG. 6, implemented using the DNW-ESD diode of FIGS. 7A/7B and the PSUB-ESD diode of FIGS. 8A/8B in an integrated circuit.

FIG. 9 illustrates a plan view of an ESD protection module 900 according to one example. The module 900 implements the ESD protection circuit 600, and includes one instance of each of the DNW-ESD diode 700 and the PSUB-ESD diode 800. The diodes 700 and 800 are implemented in a common substrate 910, which may be a portion of an integrated circuit that includes one or more protected nodes. The diodes 700 and 800 are configured such that the cathode of the PSUB-ESD diode 800 is connected via a metal interconnect line to the anode of the DNW-ESD diode 700. The node connecting these terminals is the protected node of the circuit, and may be connected by additional interconnections, not shown, to a device terminal to be protected, e.g. a source, drain or gate of a MOS transistor. The anode of the PSUB-ESD diode 800 is connected to a low-side power rail, e.g. $V_{SS}$, while the cathode of the DNW-ESD diode 700 is connected to a high-side power rails, e.g. $V_{DD}$. Multiple instances of the ESD protection module 900 may be placed on an integrated circuit, with one instance providing ESD protection to each circuit node to be protected. The sizes of the DNW-ESD diode 700 ad the PSUB-ESD diode 800 are not necessarily to scale, and need not be equal. In practice, however, it may be advantageous in some applications for the current capacity of the two diodes to be about equal.

Now referring to FIGS. 10A-10L an integrated circuit (IC) 1000 is shown in various stages of fabrication. The IC 1000 includes a diode 1000A and a diode 1000B. A device to be protected, e.g. a transistor 1000C, is shown next to the diode 1000B, though in various implementations the protected device may be located remote from the diodes 1000A, 1000B. The diode 1000A is schematically representative of a DNW-ESD diode as described previously, as exemplified by the diodes 500A-500D and 700. The diode 1000B is schematically representative of a PSUB-ESD diode as described previously, as exemplified by the diode element 200 and the diode 800. The transistor 1000C is schematically representative of any integrated electronic device that has a terminal accessible for ESD protection, and is shown without limitation as a conventional NMOS transistor. Those skilled in the art will recognize that the described processes may be modified as appropriate to form a PMOS transistor. For convenience the diodes 1000A and 1000B are shown without implied limitation as each having three electrode fingers. Those skilled in the pertinent art can readily adapt the illustrated manufacturing sequence to other configurations such as the ESD protection module 900.

Figure 10A:
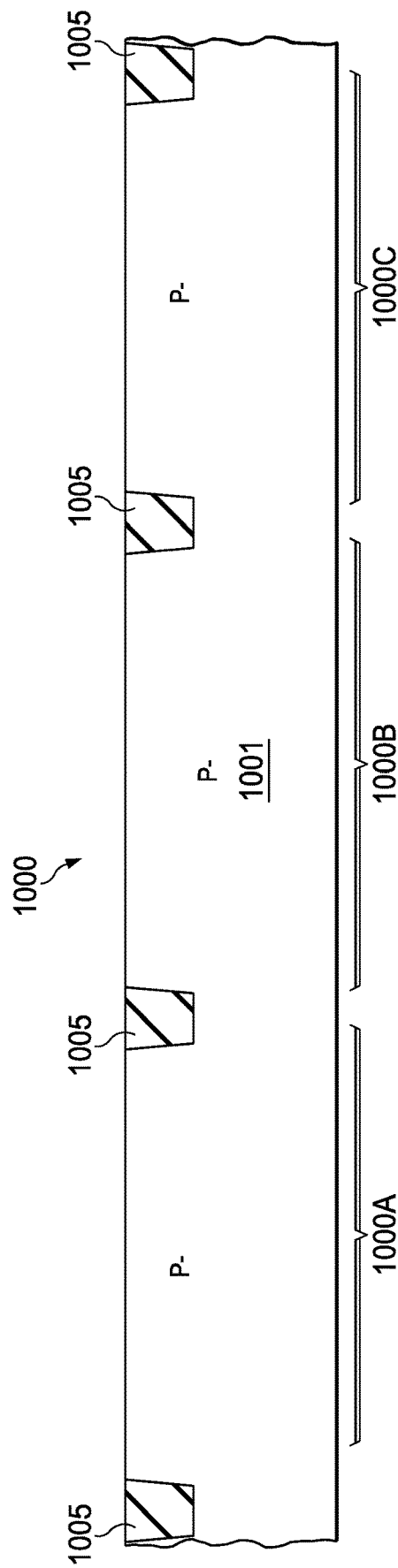
FIGS. 10A-10L illustrate an example sequence of manufacturing steps to produce an integrated circuit including an ESD protection circuit such as the ESD protection circuit of FIG. 6.
Figure 10B:
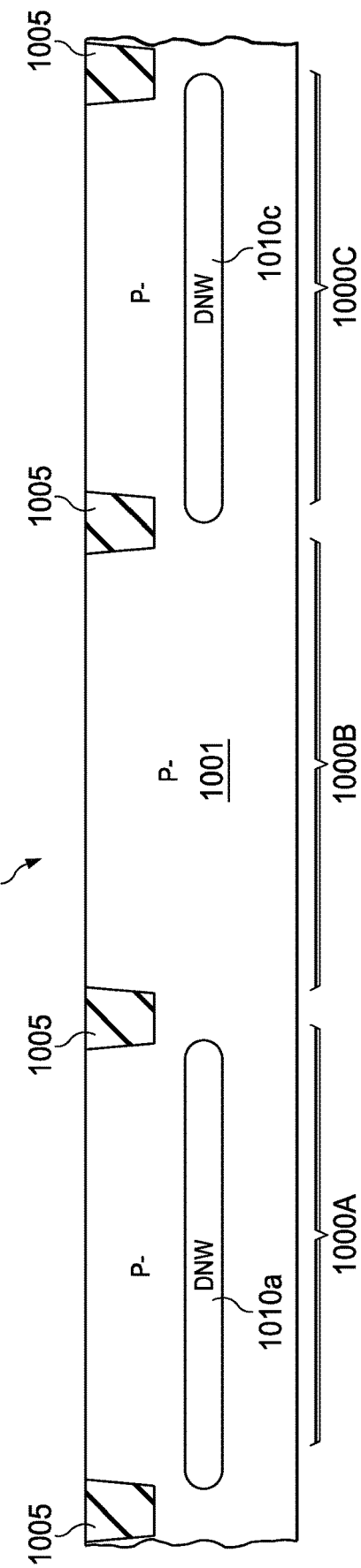

In FIG. 10A, the diode 1000A and 1000B, and the transistor 1000C are shown at an early stage of fabrication on a substrate 1001. Isolation regions 1005, e.g. STI structures, have been formed at an earlier processing step. The transistor 1000C is described in the following discussion as an NMOS transistor. The substrate 1001 is illustrated in this example a lightly-doped P-type substrate. In some cases the substrate 1001 will be or include an epitaxial layer formed on an underlying substrate, e.g. a silicon wafer. The substrate 1001 has a bulk dopant concentration. As used herein, the term "bulk dopant concentration" means a homogenous concentration of dopant in the substrate 1001 prior to modification by, e.g. implantation of dopants into the substrate 1001. Portions of the substrate 1001 that are not affected by forming various devices thereon retain the bulk dopant concentration after such processing. FIG. 10B illustrates the IC 1000 after forming a deep N-well, or DNW, 1010a in the region of the substrate 1001 in which the diode 1000A is located, and a DNW 1010c in the region of the substrate 1001 in which the transistor 1000C is located. The deep N-wells 1010a, 1000c may be formed, e.g. by deep implantation through a patterned mask of an N-type dopant such as phosphorous with a dopant flux of 1E13-5E13 cm$^{-2}$, and an implant energy of 700-1200 keV.

Figure 10C:
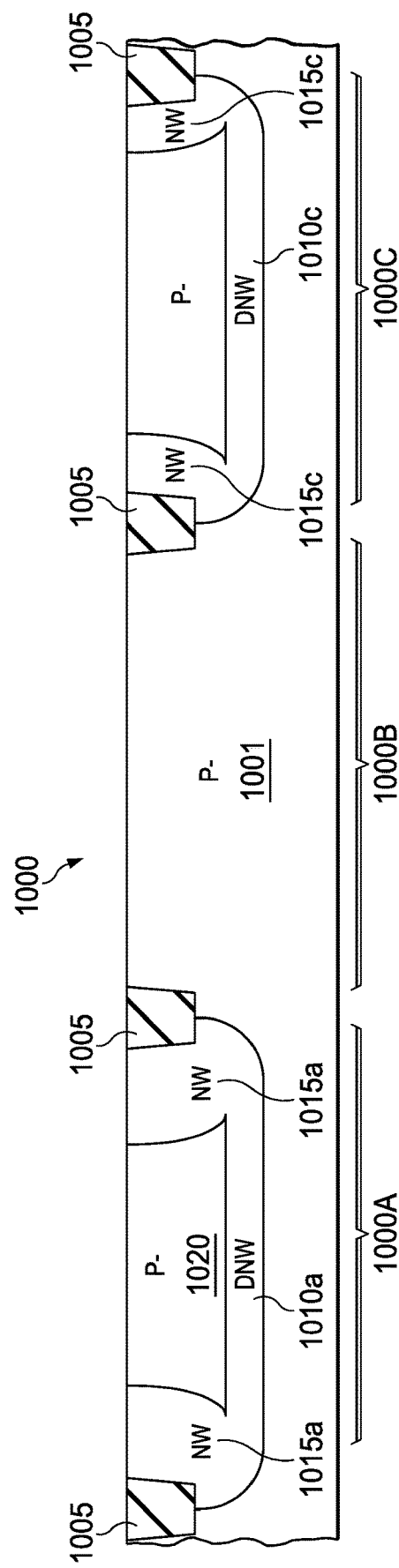
Figure 10D:
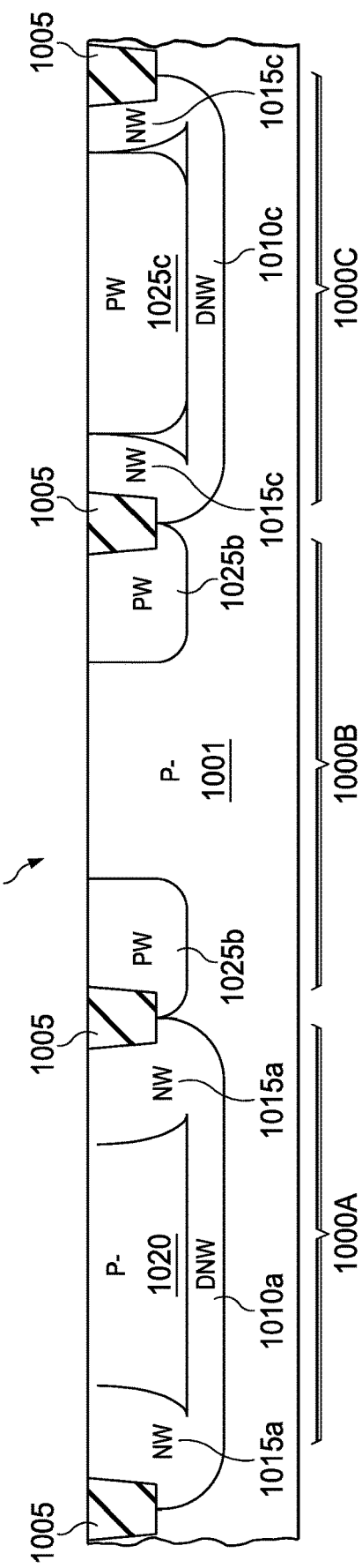

In FIG. 10C N-type wells, or N-wells, 1015a, 1015c have been formed, e.g. by implantation of an N-type dopant through openings in an implant mask. The N-wells 1015a, 1015c extend from the surface of the substrate 1001 to the deep-n wells 1010a, 1000c. The N-wells 1015a, 1015c may be formed, e.g. by implantation of an N-type dopant such as phosphorous with a dopant flux of 1E13-8E13 cm$^{-2}$, and an implant energy of 200-400 keV. The N-wells 1015a and DNW 1010a surround an enclosed portion 1020 of the P$^-$ substrate 1001. In FIG. 10D Two P-type wells, or P-wells, 1025b are located in the region in which the diode 1000B is formed, and a single P-well 1025c is located where the transistor 1000C is located. The P-wells 1025b, 1025c may be formed by, e.g. implantation of a P-type dopant such as boron through openings in an implant mask. The P-wells 1025b, 1025c may be formed, e.g. by implantation of a P-type dopant such as boron with a dopant flux of 1E13-5E13 cm$^{-2}$, and an implant energy of 100-250 keV.

Figure 10E:
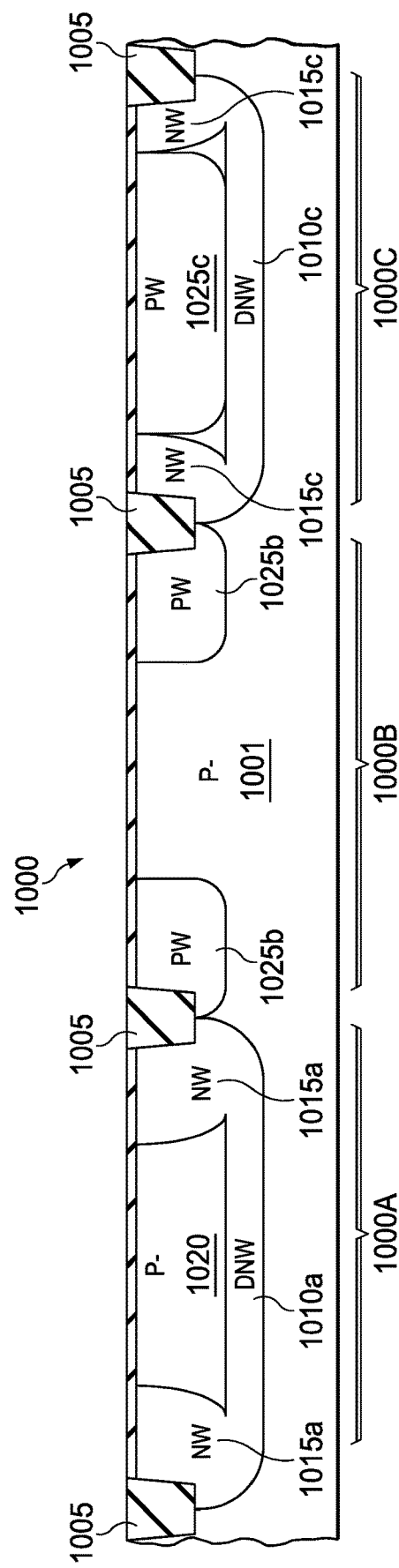
Figure 10F:
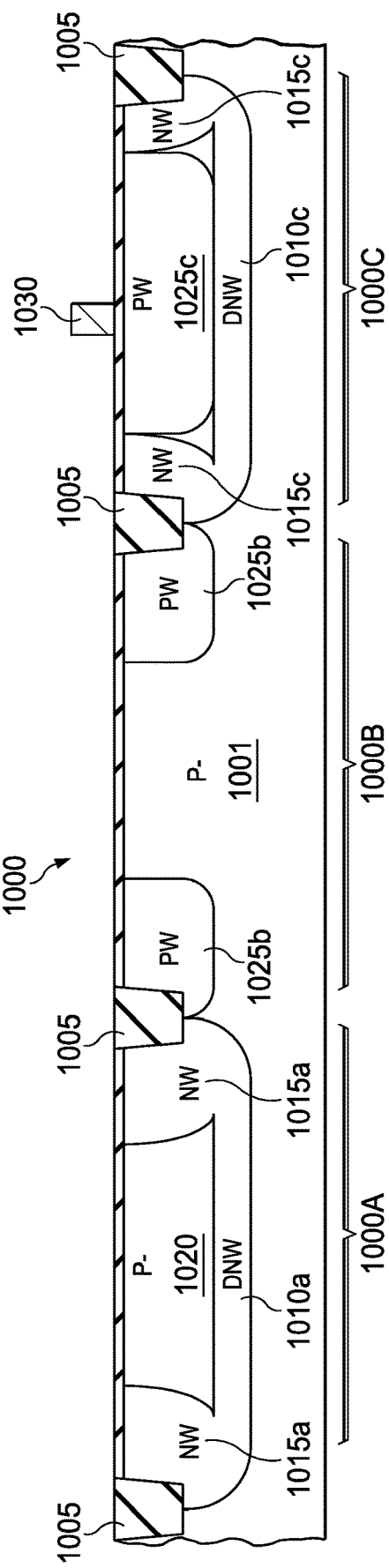

FIG. 10E illustrates the IC 1000 after formation of an unreferenced oxide layer, e.g. by conventional steam oxidation of the substrate 1001 surface. The oxide layer may be thermally nitrided by forming in an NH$_3$/NO ambient, or a grown oxide layer may be subjected to direct/remote plasma nitridation. Portions of the oxide layer may form a gate oxide layer in the transistor 1000C, as well as a layer within dielectric structures located over the diodes 1000A and 1000B in a later stage of manufacturing. In FIG. 10F a gate electrode 1030 has been formed in the transistor 1000C. The gate electrode 1030 may be formed conventionally, including deposition of a polysilicon layer, optional N/P-type doping of the polysilicon, and patterning the polysilicon layer.

Figure 10G:
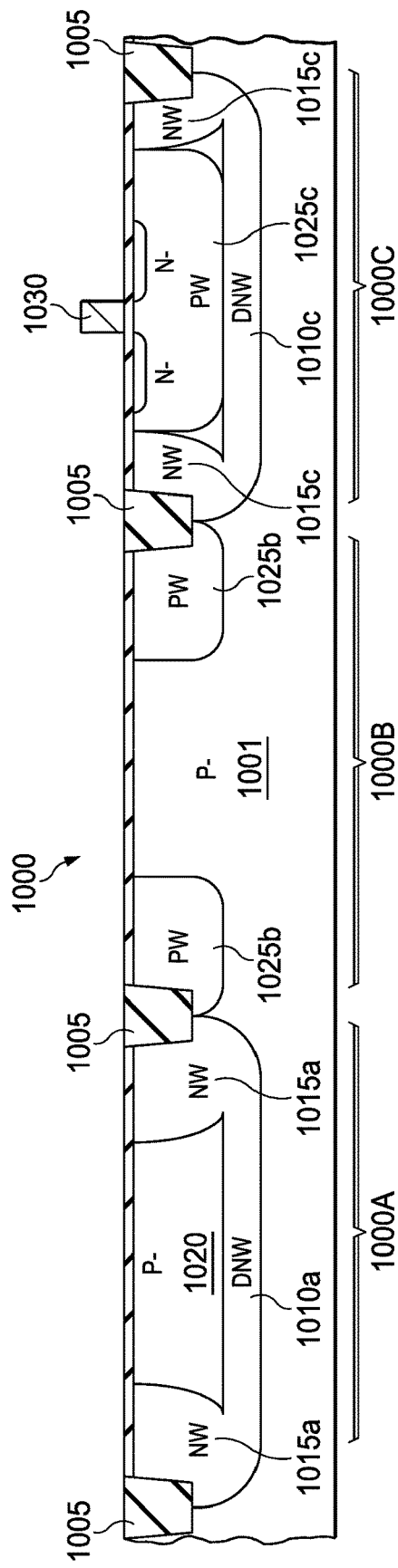
Figure 10H:
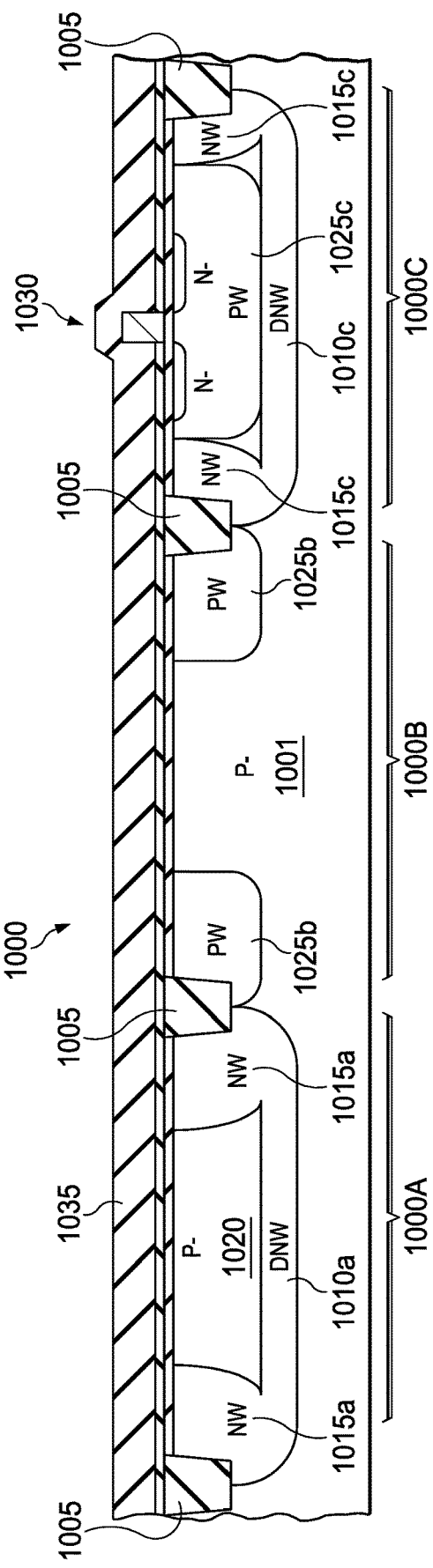

FIG. 10G illustrates the IC 1000 after forming unreferenced N-type regions in the P-well 1025c, e.g. by conventional implantation of an N-type dopant. These regions may form lightly-doped source/drain extensions in the transistor 1000C. In FIG. 10H, an unreferenced oxide liner has been formed over the substrate 1001 surface and the gate electrode 1030, and a nitride layer 1035 has been formed over the oxide liner. Both the oxide liner and the nitride layer 1035 may be formed by respective conventional PECVD processes. In some examples the oxide liner may have a thickness within a range from about 5 nm to about 30 nm. The nitride layer 1035 may comprise SiN or SiON, and may be used in the process flow as a SiBLK layer. In some embodiments the nitride layer 1035 may have a thickness within a range from about 10 nm to about 100 nm. Thus in various embodiments the combined thickness of the oxide liner and the nitride layer 1035 may be less than about 500 nm, and in some examples within a range from about 15 nm to about 130 nm.

Figure 10I:
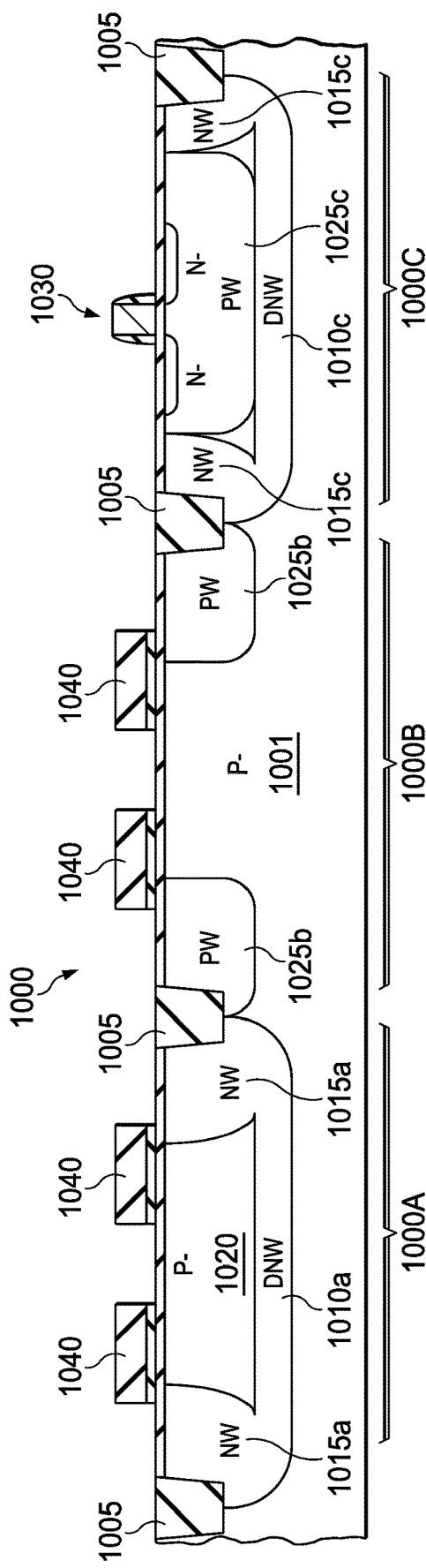
Figure 10J:
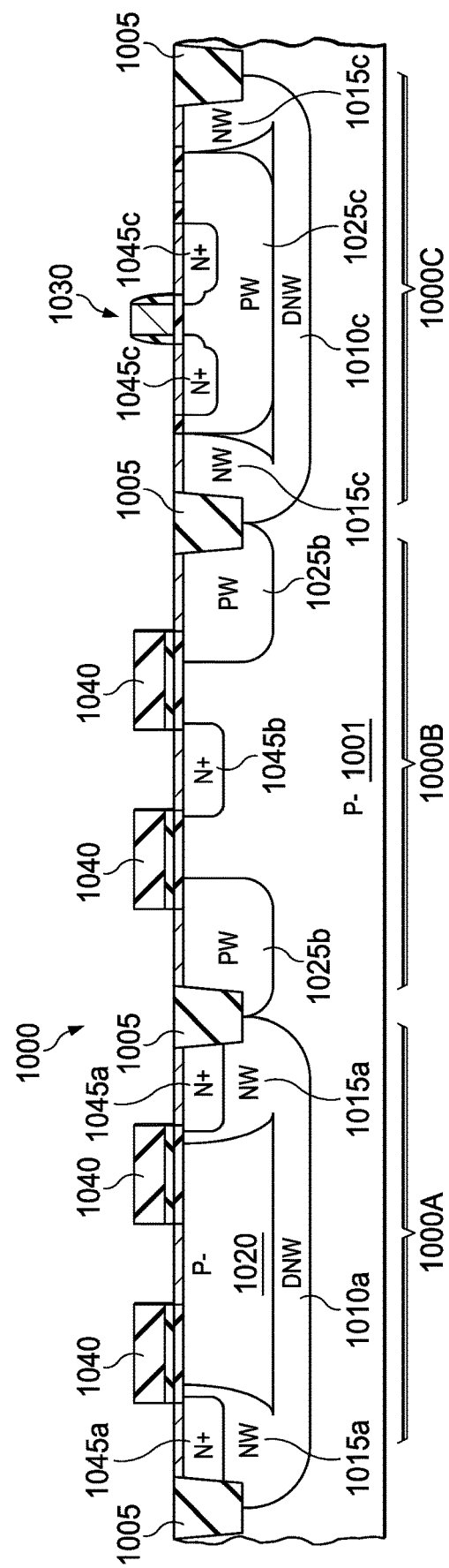

FIG. 10I illustrates the IC 1000 after patterning of the nitride layer 1035. The patterning may be done by forming a photoresist pattern on the nitride layer 1035 and removing unprotected portions of the layer by plasma etch. The patterning results in unreferenced spacers on sidewalls of the gate electrode 1030, and dielectric structures 1040. In FIG. 10J an N-type implant has been performed to form NSD (cathode) regions 1045a of the diode 1000A, an NSD (cathode) region 1045b of the diode 1000B, and NSD (cathode) regions 1045c of the transistor 1000C. The implant may provide an N-type dopant such as arsenic with a flux of 1E15-4E15 cm$^{-2}$, with an energy of about 10-50 keV, and phosphorous with a flux of 1E15-4E15 cm$^{-2}$, with an energy of about 2-10 keV.

Figure 10K:
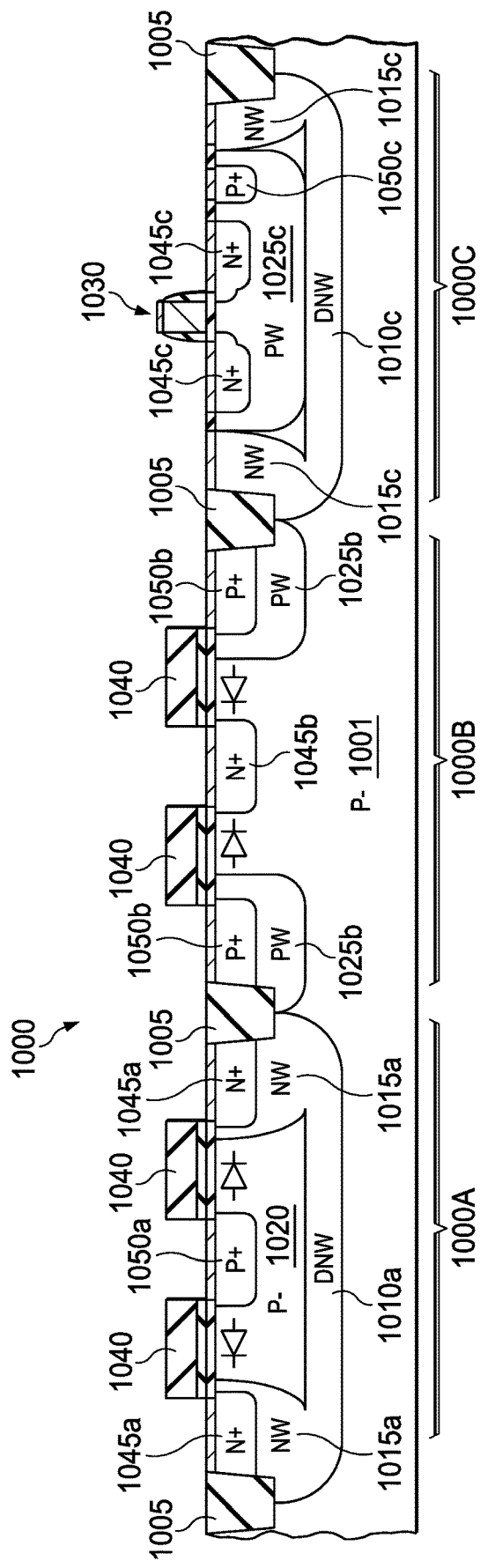

In FIG. 10K a P-type implant has been performed to form a PSD (anode) region 1050a of the diode 1000A, PSD (anode) regions 1050b of the diode 1000B, and a P$^+$ contact region 1050c of the transistor 1000C. The implant may provide a P-type dopant such as boron with a dose of about 1E15-8E15 cm$^{-2}$, and an energy of about 1-10 keV. Optionally a co-implant dopant may be implanted to place carbon and/or nitrogen into the PSD regions 1050a, 1050b and/or the NSD regions 1045a, 1045b, e.g. to stabilize the N-type or P-type dopant against diffusion drift. The co-implant dopant may include nitrogen with a flux of 1E15-4E15 cm$^{-2}$ and an energy of 10-30 keV, and/or carbon with a flux of 2E14-3E15 cm$^{-2}$ and an energy of 2-15 keV. In each of the N$^+$ and P$^+$ dopant implants, the dielectric structures 1040 act to block dopants from the region of the substrate 1001 between the NSD regions 1045a, 1045b and the respective PSD regions 1050a, 1050b. These substrate regions may have an insignificant concentration of carbon and/or nitrogen after the co-implant dopant step, e.g. less than about 1E14 cm$^{-3}$, possibly advantageously limiting capacitance of the diodes. When the substrate has an insignificant concentration of one or more of the co-implant dopants, the substrate is regarded to be "substantially free" of the one or more co-implant dopants.

Figure 10L:
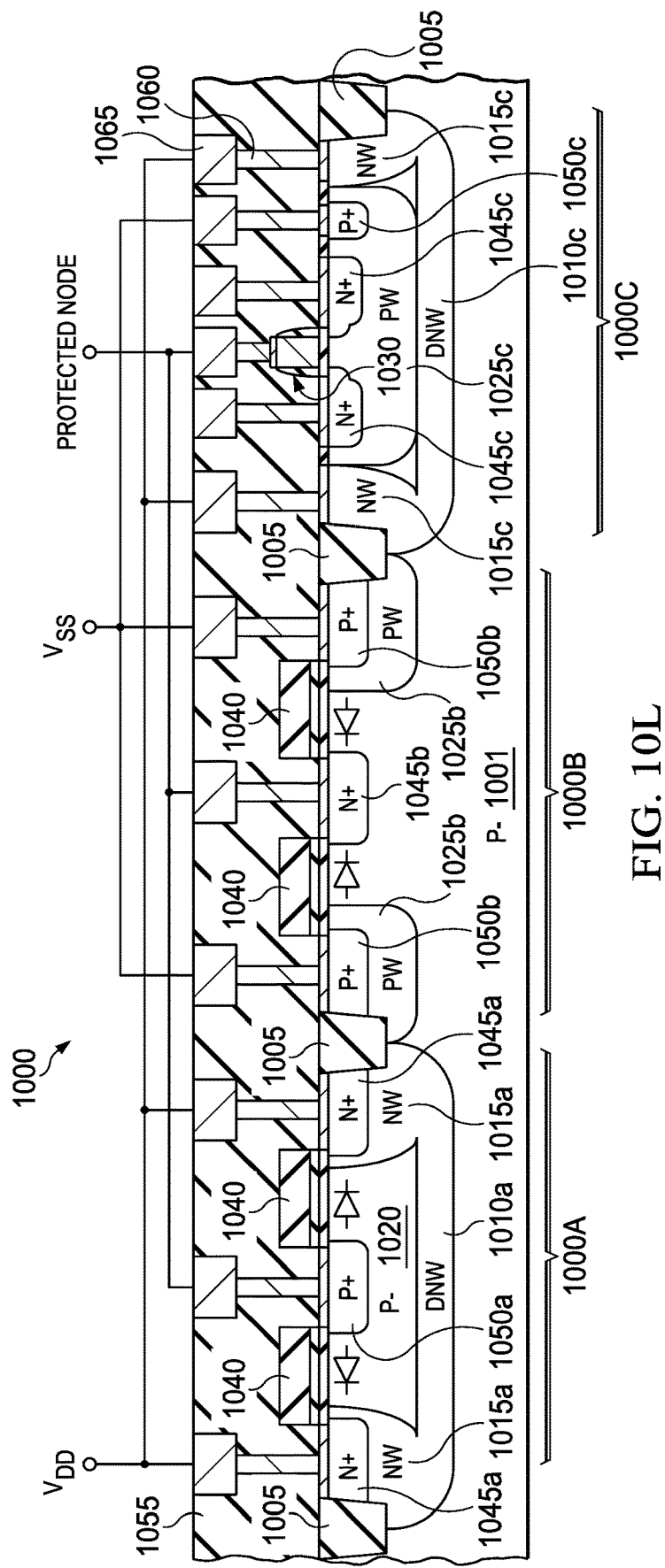

FIG. 10L illustrates the IC 1000 after forming a dielectric layer 1055 over the diodes 1000A, 1000B and the transistor 1000C. Contacts 1060 provide signal paths between these devices and interconnects 1065, which may be connected by additional interconnects, shown schematically. The interconnects may implement the protection circuit 600 (FIG. 6) by connecting the NSD regions 1045a to a higher voltage node ($V_{DD}$) of power supplied to the IC 1000, connecting the PSD regions 1050b to a lower voltage node ($V_{SS}$) of the supplied power, and connecting the PSD region 1050a to the NSD region 1045b. As connected, this node may be designated the protected node, and may be further connected to a terminal of the transistor 1000C. The P-well 1025c is connected to $V_{SS}$ via the P$^+$ contact region 1050c, and the DNW 1010c is connected to $V_{DD}$ via the N-wells 1015c. Thus the P-well 1025c is surrounded by a reverse-biased junction and the transistor 1000C is isolated from the substrate 1001 and the diodes 1000A, 1000B. As illustrated, the gate electrode 1030 is connected to the protected node, thus providing input protection to the transistor 1000C. In other embodiments another terminal of the transistor 1000C may be connected to the protected node, e.g. NSD regions 1045c. Other electronic devices may have different numbers and types of input and/or output terminals, and in general the protected node may be connected to any such terminal to provide ESD protection to that terminal. Each terminal of the protected device may be connected a separate instance of the protection circuit 1000.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. An electronic device, comprising:
    a semiconductor substrate having a first conductivity type;
    a buried layer located within the substrate and having a second conductivity type;
    a first doped region of the first conductivity type extending from a surface of the substrate into the substrate;
    a second doped region of the second conductivity type spaced apart from the first doped region and extending from the surface of the substrate into the substrate;
    a third doped region of the first conductivity type and a fourth doped region of the second conductivity type each extending from the surface into the substrate, the second doped region located between the first and third doped regions, and the third doped region located between the second and fourth doped regions;
    a noncontiguous substrate region extending to the surface between the first and second doped regions and having a dopant concentration less than a dopant concentration of the first doped region;
    a substrate region extending to the surface between the third and fourth doped regions;
    a well region having the second conductivity type extending from the second doped region to the buried layer, the well region and buried layer isolating the noncontiguous substrate region from the substrate region;
    a dielectric isolation region extending into the substrate between and abutting the second and third doped regions; and
    a conductive connection between the first doped region and the fourth doped region.

2. The electronic device of claim 1, further comprising a first dielectric structure located on the substrate surface between the first and second doped regions and a second dielectric structure located on the substrate surface between the third and fourth doped regions.

3. The electronic device of claim 2, wherein the first and second dielectric structures each include a gate dielectric layer between an upper dielectric layer and the substrate.

4. The electronic device of claim 2, wherein the first and second dielectric structures each comprise a material layer selected from the group consisting of:
    silicon nitride;
    silicon dioxide; and
    silicon oxynitride.

5. The electronic device of claim 1, further comprising a polysilicon structure located over the substrate surface between and partially overlapping the first and second doped regions.

6. The electronic device of claim 1, wherein the first doped region or the second doped region includes a co-implant dopant and a portion of the substrate surface between the first and second doped regions is substantially free of the co-implant dopant.

7. The electronic device of claim 1, wherein the first and fourth doped regions are conductively connected to an input terminal or an output terminal of an integrated circuit.

8. The electronic device of claim 1, wherein the second doped region includes a first subregion having a first dopant concentration and a second subregion having a second dopant concentration greater than the first dopant concentration located within the first subregion, and the first subregion intersects the substrate surface between the second subregion and the first doped region.

9. The electronic device of claim 1, further comprising a fifth doped region having the second conductivity type, wherein the well region is a first well region, the noncontiguous substrate region extends to the surface of the substrate between the first and fifth doped regions, and a second well region of the second conductivity type extends from the fifth doped region to the buried layer.

10. The electronic device of claim 1, wherein the first doped region is conductivity coupled to a transistor terminal.

11. The electronic device of claim 1, wherein the first conductivity type is P-type and the second conductivity type is N-type.

12. A method of forming an integrated circuit, comprising:
- forming a buried layer having a second conductivity type within a semiconductor substrate having a first conductivity type;
- forming a first doped region of the first conductivity type extending from a surface of the substrate into the substrate;
- forming a second doped region of the second conductivity type spaced apart from the first doped region and extending from the surface of the substrate to the buried layer;
- forming a dielectric isolation structure extending from the surface into the substrate and touching the second doped region;
- forming a third doped region of the first conductivity type extending from a surface of the substrate into the substrate and touching the dielectric isolation structure; and
- forming a fourth doped region of the second conductivity type spaced apart from the third doped region such that a portion of the substrate isolated from the first doped region by the buried layer extends to the surface between the third and fourth doped regions,
- wherein a noncontiguous substrate region located between the first doped region and the buried layer has a dopant concentration less than a dopant concentration of the first doped region.

13. The method of claim 12, wherein the first conductivity type is P-type and the second conductivity type is N-type.

14. The method of claim 12, further comprising forming a first dielectric structure on the semiconductor surface between the first and second doped regions, and forming a second dielectric structure on the semiconductor surface between the third and fourth doped regions.

15. The method of claim 14, further comprising forming first and second polysilicon structures respectively on the first and second dielectric structures.

16. The method of claim 14, wherein the first and second dielectric structures each comprise a material layer selected from the group consisting of:
- silicon nitride;
- silicon dioxide; and
- silicon oxynitride.

17. The method of claim 14, further comprising implanting a co-implant dopant into the first and second doped regions, wherein the substrate between the first and second doped regions is substantially free of the co-implant dopant after the implanting.

18. The method of claim 12, further comprising conductively connecting the first and fourth doped regions to an input terminal or an output terminal of an integrated circuit.

19. The method of claim 12, further comprising forming a surface doped region within the second doped region, the surface doped region having the second conductivity type and a higher dopant concentration than the second doped region, wherein a portion of the second doped region is located between the surface doped region and the first doped region at the substrate surface.

20. The method of claim 18, further comprising conductively connecting the second doped region to a first voltage rail and conductively connecting the third doped region to a different second voltage rail.

21. An integrated circuit, comprising
- a P-type lightly-doped semiconductor substrate;
- a N-type buried layer located within the substrate;
- first and second N-wells extending from a surface of the substrate to the buried layer;
- a first NSD region located within the first N-well, and a second NSD region located within the second N-well;
- a first P-type source/drain (PSD) region extending from the substrate surface into the substrate and located between the first and second NSD regions;
- a first P-type lightly-doped substrate portion located between the N-type buried layer and the substrate surface and between the PSD region and the first and second NSD regions;
- a P-well extending from the surface into a second P-type lightly doped substrate portion isolated from the first P-type lightly doped substrate portion by the buried layer and the first and second N-wells;
- a second PSD region extending from the substrate surface into the P-well; and
- a dielectric isolation structure extending into the substrate and touching the second NSD region and the second PSD region.

22. The integrated circuit of claim 21, further comprising first and second dielectric structures located over the substrate surface, the first dielectric structure having a first side located over the first PSD region and a second side located over the first NSD region, and the second dielectric structure having a first side located over the first PSD region and a second side located over the second NSD region.

* * * * *